(12) United States Patent
Sakamoto et al.

(10) Patent No.: US 9,893,016 B2
(45) Date of Patent: Feb. 13, 2018

(54) MULTILAYER WIRING BOARD HAVING WIRING STRUCTURE FOR MOUNTING MULTIPLE ELECTRONIC COMPONENTS AND METHOD FOR MANUFACTURING THE SAME

(71) Applicant: IBIDEN CO., LTD., Ogaki-shi (JP)

(72) Inventors: Hajime Sakamoto, Ogaki (JP); Yoshinori Shizuno, Ogaki (JP); Shigeru Yamada, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/880,299

(22) Filed: Oct. 12, 2015

(65) Prior Publication Data

US 2016/0105960 A1    Apr. 14, 2016

(30) Foreign Application Priority Data

Oct. 10, 2014    (JP) .................. 2014-209083

(51) Int. Cl.
*H01L 23/538* (2006.01)
*H05K 3/00* (2006.01)
(Continued)

(52) U.S. Cl.
CPC ........ *H01L 23/5383* (2013.01); *H01L 21/486* (2013.01); *H05K 3/007* (2013.01);
(Continued)

(58) Field of Classification Search
CPC ... H05K 1/11; H05K 3/46; H05K 3/00; H05K 1/02; H05K 3/10; H05K 1/112;
(Continued)

(56) References Cited

U.S. PATENT DOCUMENTS 5,258,648 A    11/1993 Lin
5,532,094 A *  7/1996 Arimura ............... C23C 22/52
                                                    134/3

(Continued)

FOREIGN PATENT DOCUMENTS

JP    2011-159855    *  8/2011
JP    2013-214578 A    10/2013

OTHER PUBLICATIONS

U.S. Appl. No. 14/809,455, filed Jul. 27, 2015, Sakamoto.

*Primary Examiner* — Michael F McAllister
(74) *Attorney, Agent, or Firm* — Oblon, McClelland, Maier & Neustadt, L.L.P.

(57) ABSTRACT

A multilayer wiring board includes a main wiring board including insulation layers, first via conductors formed in the insulation layers, and a first conductive layer including first mounting pads such that the first mounting pads are positioned to mount a first electronic component and a second electronic component adjacent to each other on the main wiring board, and a wiring structure body mounted on the main wiring board such that the wiring structure body is positioned in an outermost insulation layer of the insulation layers, the wiring structure body including a second conductive layer which includes second mounting pads such that the second mounting pads are positioned to connect to the first electronic component and the second electronic component mounted on the main wiring board. The first via conductors are formed such that the first via conductors have diameters which increase in a same direction.

16 Claims, 36 Drawing Sheets

(51) Int. Cl.
 *H05K 3/46* (2006.01)
 *H01L 21/48* (2006.01)
 *H05K 3/02* (2006.01)

(52) U.S. Cl.
 CPC ......... *H05K 3/4644* (2013.01); *H05K 3/4658* (2013.01); *H05K 3/4694* (2013.01); *H01L 2224/16227* (2013.01); *H01L 2224/1703* (2013.01); *H01L 2924/15192* (2013.01); *H01L 2924/15313* (2013.01); *H05K 3/025* (2013.01); *H05K 2201/1053* (2013.01); *H05K 2201/10159* (2013.01); *H05K 2201/10378* (2013.01)

(58) Field of Classification Search
 CPC .. H05K 1/0298; H05K 1/0201; H05K 3/0011; H05K 3/36; H05K 3/0029; H05K 7/142
 USPC .................. 174/252, 261; 257/774; 438/667
 See application file for complete search history.

(56) References Cited

U.S. PATENT DOCUMENTS

| | | | |
|---|---|---|---|
| 6,190,834 B1 | 2/2001 | Narahara | |
| 6,281,446 B1* | 8/2001 | Sakamoto | H01L 23/13 174/255 |
| 6,379,159 B1 | 4/2002 | Mune | |
| 6,687,985 B2* | 2/2004 | Sakamoto | H01L 23/13 174/250 |
| 6,818,989 B2 | 11/2004 | Higuchi | |
| 6,952,049 B1* | 10/2005 | Ogawa | H01G 4/232 257/678 |
| 2001/0051393 A1 | 12/2001 | Ogino | |
| 2003/0089868 A1 | 5/2003 | Ito | |
| 2004/0183187 A1 | 9/2004 | Yamasaki | |
| 2005/0255303 A1* | 11/2005 | Sawatari | H01L 23/142 428/209 |
| 2006/0001179 A1 | 1/2006 | Fukase | |
| 2006/0087015 A1 | 4/2006 | Yuan | |
| 2007/0267740 A1 | 11/2007 | Khan | |
| 2010/0213600 A1 | 8/2010 | Lau | |
| 2011/0240357 A1* | 10/2011 | Kariya | H01L 23/5389 174/266 |
| 2012/0319254 A1 | 12/2012 | Kikuchi | |
| 2013/0016477 A1 | 1/2013 | Yokoya | |
| 2013/0026632 A1 | 1/2013 | Kikuchi | |
| 2013/0027895 A1 | 1/2013 | Hayashi | |
| 2013/0119555 A1 | 5/2013 | Sundaram | |
| 2013/0256000 A1* | 10/2013 | Terui | H05K 1/0298 174/251 |
| 2013/0258625 A1* | 10/2013 | Terui | H05K 1/115 361/774 |
| 2014/0347837 A1 | 11/2014 | Kariya | |
| 2015/0096798 A1 | 4/2015 | Uzoh | |
| 2015/0097284 A1 | 4/2015 | Uzoh | |
| 2015/0145116 A1 | 5/2015 | Uzoh | |
| 2015/0145140 A1 | 5/2015 | Haba | |
| 2015/0145141 A1 | 5/2015 | Uzoh | |
| 2015/0255364 A1 | 9/2015 | Gao | |
| 2015/0255429 A1 | 9/2015 | Katkar | |
| 2015/0270209 A1 | 9/2015 | Woychik | |
| 2015/0371938 A1 | 12/2015 | Katkar | |

\* cited by examiner

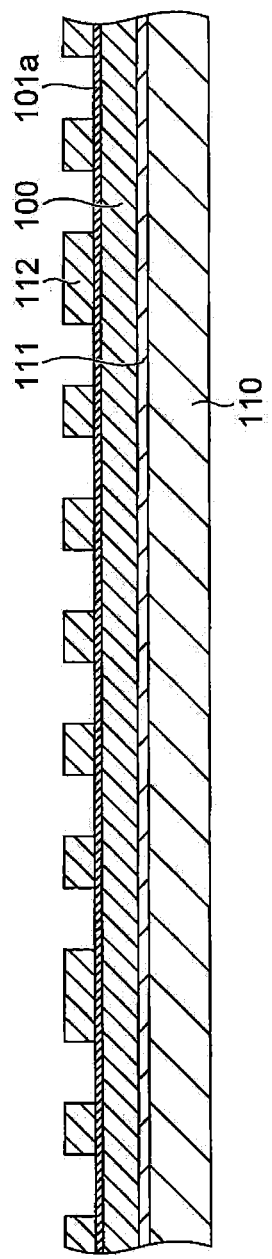

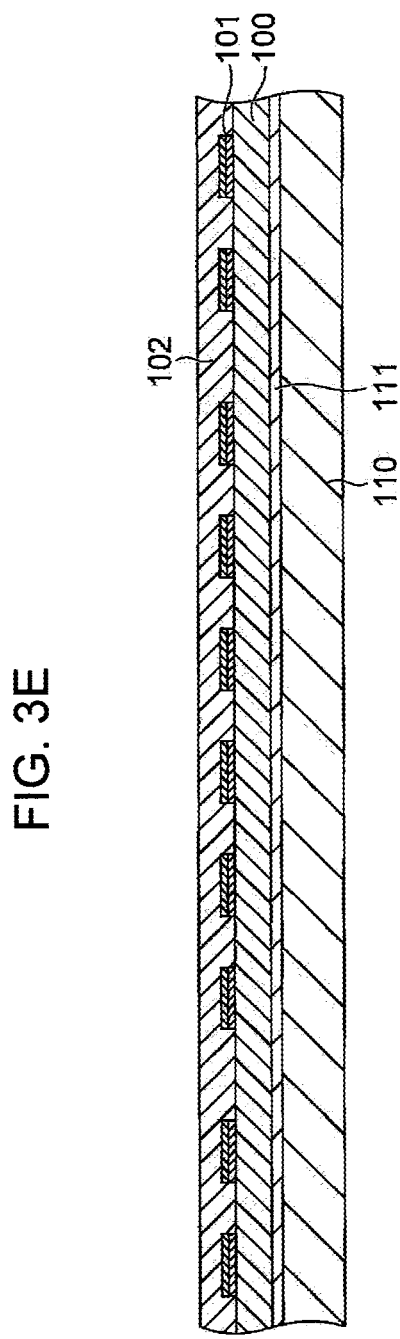

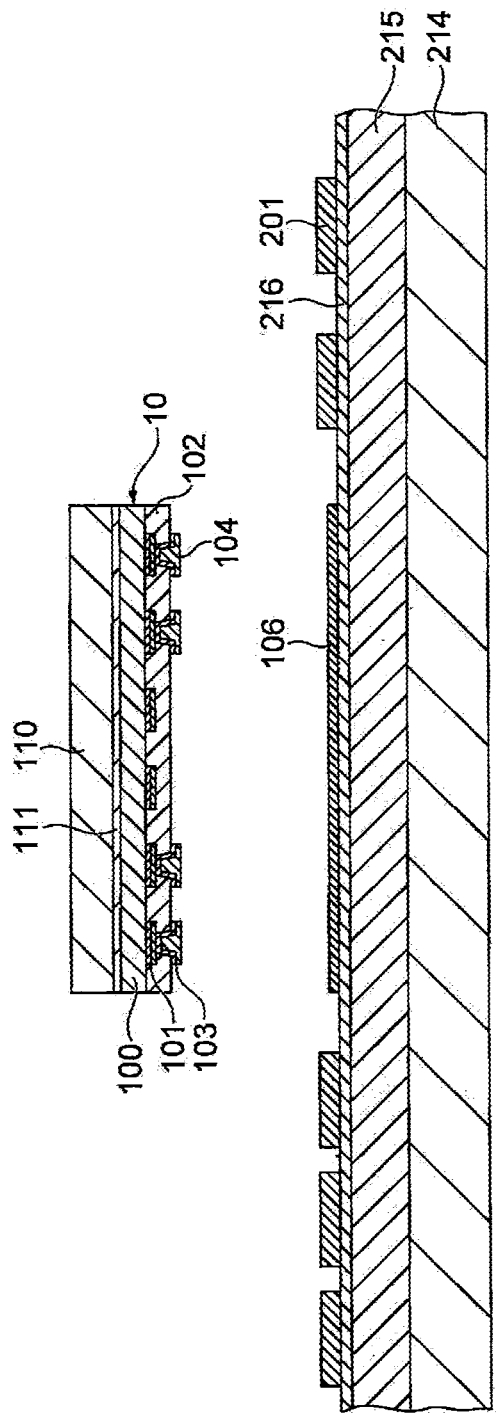

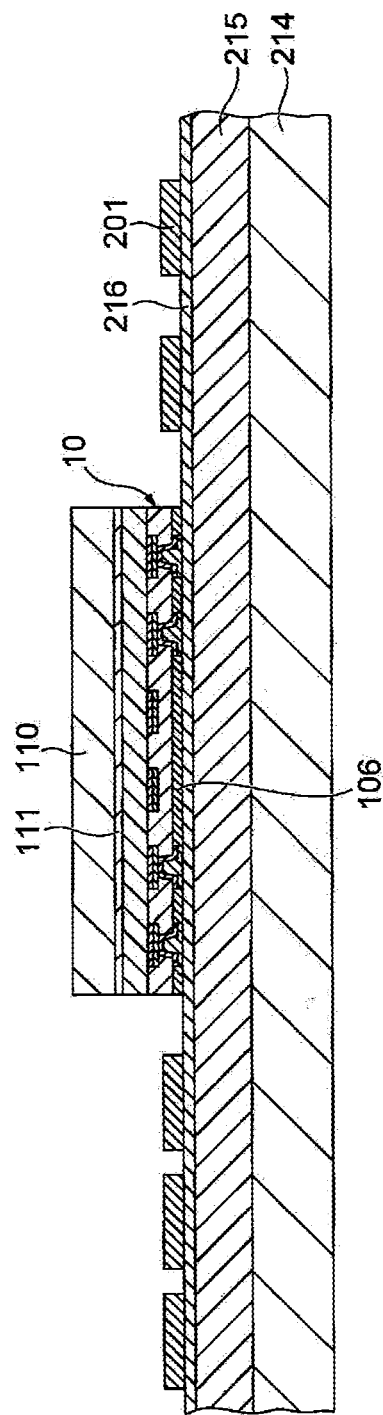

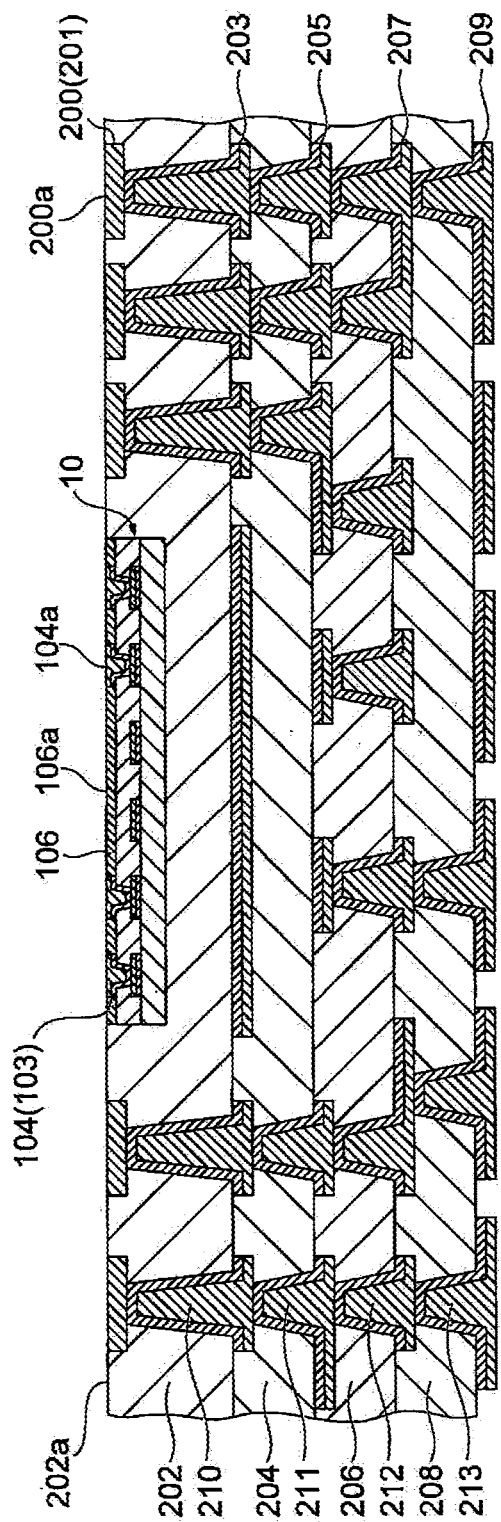

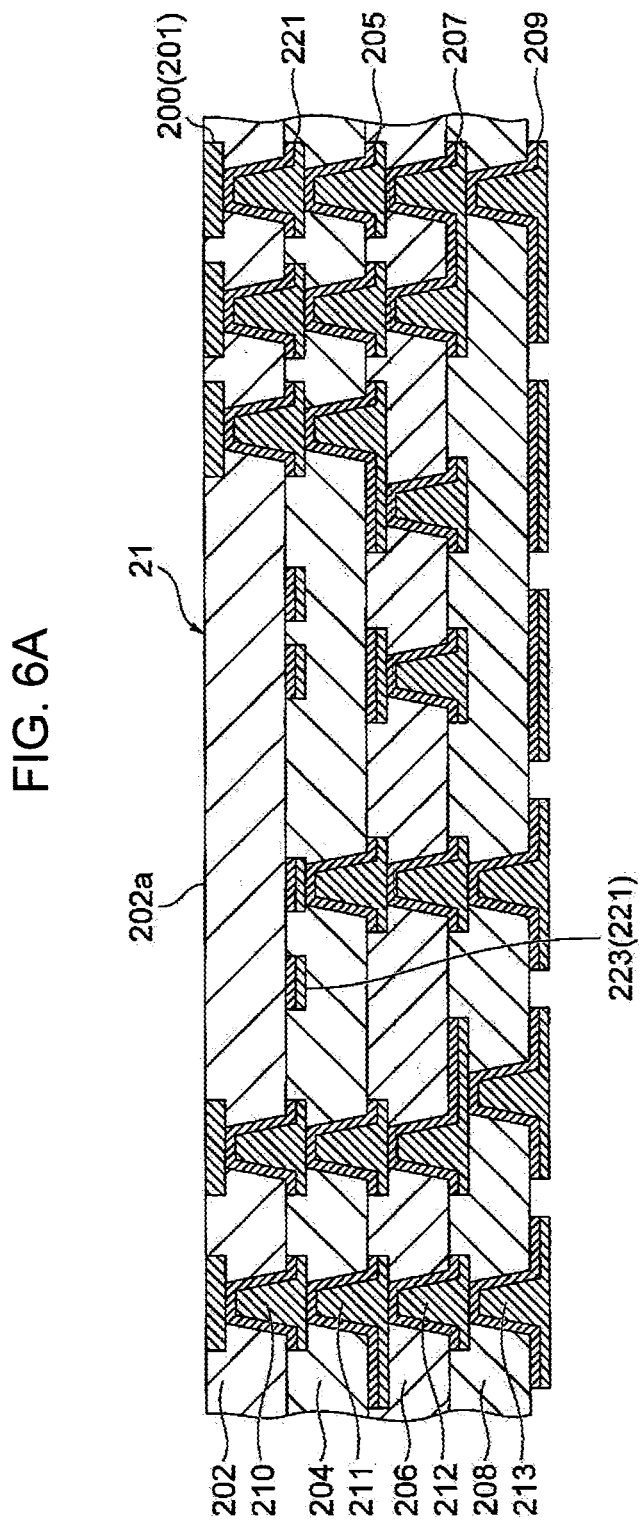

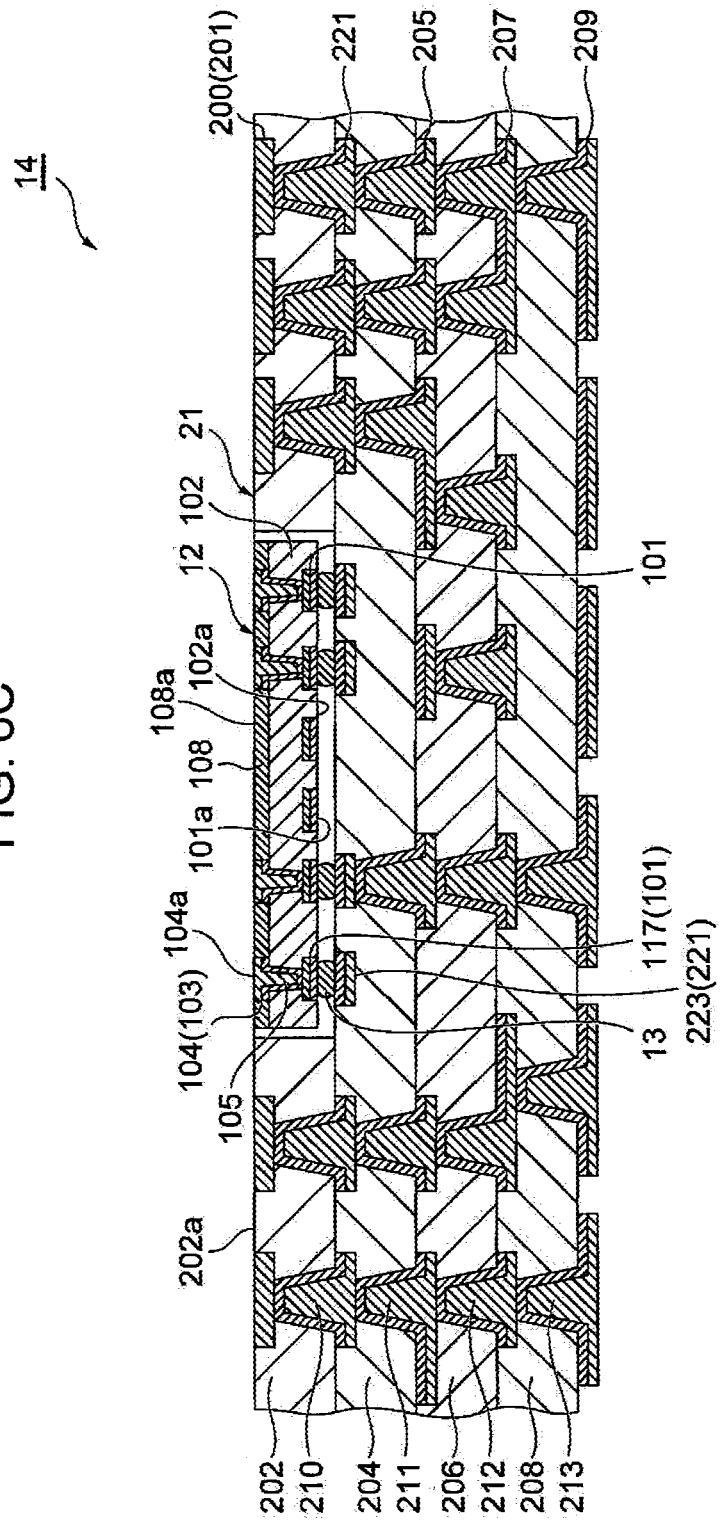

MULTILAYER WIRING BOARD HAVING WIRING STRUCTURE FOR MOUNTING MULTIPLE ELECTRONIC COMPONENTS AND METHOD FOR MANUFACTURING THE SAME

CROSS-REFERENCE TO RELATED APPLICATIONS

The present application is based upon and claims the benefit of priority to Japanese Patent Application No. 2014-209083, filed Oct. 10, 2014, the entire contents of which are incorporated herein by reference.

BACKGROUND OF THE INVENTION

Field of the Invention

The present invention relates to a multilayer wiring board for mounting multiple electronic components and a method for manufacturing such a multilayer wiring board.

Description of Background Art

JP2013-214578A describes a multilayer wiring board which has a main wiring board formed by alternately laminating insulation layers and conductive layers on both surfaces of a core substrate and a wiring structure body embedded in the main wiring board. In the insulation layers of the main wiring board, multiple truncated-cone-shaped via conductors are formed to electrically connect adjacent conductive layers. Those via conductors are arranged on both sides of a core substrate positioned in the center of the main wiring board and have diameters that increase in opposite directions from each other. The entire contents of this publication are incorporated herein by reference.

SUMMARY OF THE INVENTION

According to one aspect of the present invention, a multilayer wiring board includes a main wiring board including insulation layers, first via conductors formed in the insulation layers, and a first conductive layer including first mounting pads such that the first mounting pads are positioned to mount a first electronic component and a second electronic component adjacent to each other on the main wiring board, and a wiring structure body mounted on the main wiring board such that the wiring structure body is positioned in an outermost insulation layer of the insulation layers, the wiring structure body including a second conductive layer which includes second mounting pads such that the second mounting pads are positioned to connect to the first electronic component and the second electronic component mounted on the main wiring board. The first via conductors are formed such that the first via conductors have diameters which increase in a same direction.

According to another aspect of the present invention, a method for manufacturing a multilayer wiring board includes forming a first conductive layer including first mounting pads on a support plate having a carrier copper foil such that the first mounting pads are formed on the carrier copper foil of the support plate, fixing on the carrier copper foil of the support plate a wiring structure body including second via conductors and a second conductive layer including second mounting pads such that the second mounting pads face the carrier copper foil of the support plate, forming on the support substrate a laminated structure including insulation layers and first via conductors formed in the insulation layers such that the laminated structure covers the first conductive layer and the wiring structure body and that the first via conductors have diameters which increase in a different direction from a direction in which diameters of the second via conductors increase, and removing the support plate and the carrier cooper foil from a structure including the first conductive layer, the wiring structure body and the laminated structure. The forming of the first conductive layer includes forming the first mounting pads such that the first mounting pads are positioned to mount a first electronic component and a second electronic component adjacent to each other on the main wiring board, and the wiring structure body includes the second conductive layer including the second mounting pads such that the second mounting pads are positioned to connect to the first electronic component and the second electronic component mounted to the first mounting pads.

According to yet another aspect of the present invention, a method for manufacturing a multilayer wiring board includes forming a main wiring board including insulation layers, first via conductors formed in the insulation layers, and a first conductive layer including first mounting pads such that the first via conductors are formed such that the first via conductors have diameters which increase in a same direction and that the first mounting pads are positioned to mount a first electronic component and a second electronic component adjacent to each other on the main wiring board, forming a recess portion in an outermost insulation layer of the insulation layers in the main wiring board, and fixing in the recess portion of the outermost insulation layer in the main wiring board a wiring structure body including a second conductive layer which includes second mounting pads such that the second mounting pads are positioned to connect to the first electronic component and the second electronic component mounted on the main wiring board. The fixing of the wiring structure body includes positioning the wiring structure body such that the second via conductors have diameters which increase in a different direction from the direction in which the diameters of the first via conductors increase and that the second conductive layer of the wiring structure body not in contact with the first conductive layer of the main wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3C is a view showing a process in the method for manufacturing a wiring structure body;

FIG. 3E is a view showing a process in the method for manufacturing a wiring structure body;

FIG. 4D is a view showing a process in the method for manufacturing a multilayer wiring board;

FIG. 4E is a view showing a process in the method for manufacturing a multilayer wiring board;

FIG. 4O is a view showing a process in the method for manufacturing a multilayer wiring board;

FIG. 6A is a view showing a process in yet another method for manufacturing a multilayer wiring board;

FIG. 6C is a view showing a process in still yet another method for manufacturing a multilayer wiring board;

DETAILED DESCRIPTION OF THE EMBODIMENTS

Figure 1:
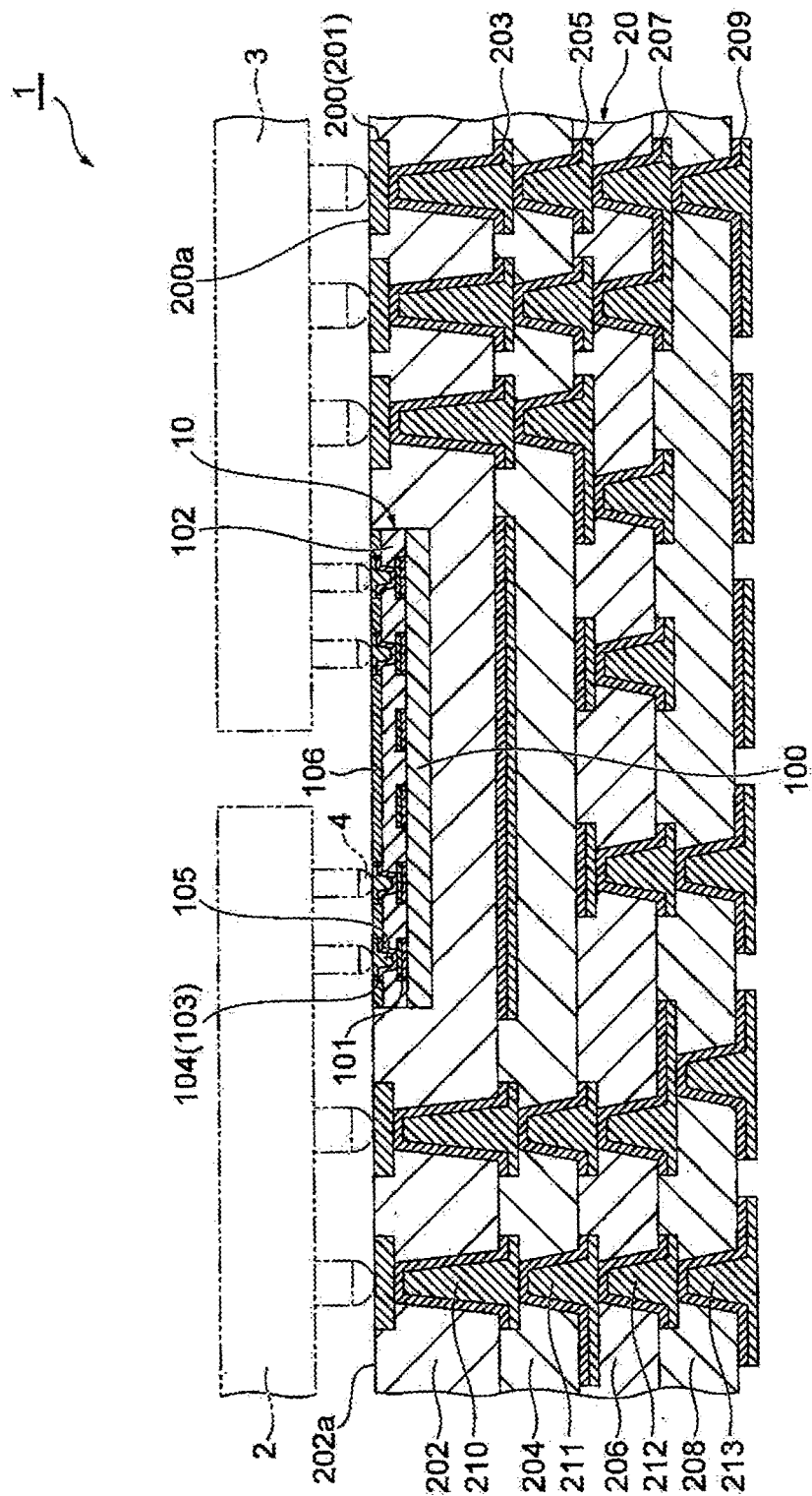
FIG. 1 is a cross-sectional view showing part of a multilayer wiring board according to a first embodiment of the present invention.

The embodiments will now be described with reference to the accompanying drawings, wherein like reference numerals designate corresponding or identical elements throughout the various drawings.

First Embodiment

As shown in FIG. 1, multilayer wiring board 1 of a first embodiment is for mounting a micro-processing unit (MPU) 2 (an electronic component) and a dynamic random access memory (DRAM) 3 (another electronic component), which are positioned adjacent to each other. Multilayer wiring board 1 is structured to have main wiring board 20 and wiring structure body 10 positioned inside main wiring board 20. Main wiring board 20 is a so-called coreless substrate, and is a buildup multilayer wiring board formed by alternately laminating multiple main insulation layers and main conductive layers. In the present embodiment, main conductive layers and later-described sub-conductive layers are wiring layers to form electrical circuits. Depending on their positions, conductive layers may include pads, wiring patterns or the like, or may include only mounting pads for mounting electronic components.

On the side of main wiring board 20 that faces MPU 2 and DRAM 3, main conductive layer (first conductive layer) 201 is formed to include multiple main mounting pads (first mounting pads) 200 for mounting MPU 2 and DRAM 3. Main conductive layer 201 is made of an electroless plated layer and an electrolytic plated layer, for example. Main mounting pads 200 are embedded in main insulation layer 202 in such a way to expose their upper surfaces (200a) while upper surfaces (200a) are made flush with upper surface (202a) of main insulation layer 202. Main insulation layer 202 is the outermost layer among multiple main insulation layers, and is made of an interlayer resin insulating material such as thermosetting epoxy resin.

Main conductive layer 203 is formed on the lower surface of main insulation layer 202. Main conductive layer 203 is made of an electroless plated layer and an electrolytic plated layer, the same as main conductive layer 201. In addition, multiple main via conductors (first via conductors) 210 are formed in main insulation layer 202. Main via conductors 210 penetrate through main insulation layer 202 and electrically connect main mounting pads 200 and main conductive layer 203.

Under main insulation layer 202 and main conductive layer 203, main insulation layer 204, main conductive layer 205, main insulation layer 206, main conductive layer 207, main insulation layer 208 and main conductive layer 209 are further laminated in that order. Main insulation layers (204, 206, 208) are made of thermosetting epoxy resin, the same as main insulation layer 202. Outermost main insulation layer 202 is set to be the thickest among main insulation layers (202, 204, 206, 208). Main conductive layers (205, 207, 209) are made of an electroless plated layer and an electrolytic plated layer, the same as main conductive layer 201.

Multiple main via conductors (first via conductors) 211 are formed in main insulation layer 204, multiple main via conductors (first via conductors) 212 are formed in main insulation layer 206, and multiple main via conductors (first via conductors) 213 are formed in main insulation layer 208. Main conductive layers (203, 205) are electrically connected by main via conductors 211, main conductive layers (205, 207) are electrically connected by main via conductors 212, and main conductive layers (207, 209) are electrically connected by main via conductors 213.

In the present embodiment, main via conductors (210, 211, 212, 213) are formed in a truncated-cone shape and have diameters increasing in the same direction. In particular, main via conductors (210, 211, 212, 213) are formed with a diameter increasing in a direction away from main mounting pads 200 (namely, in a direction away from MPU 2 and DRAM 3). As shown in FIG. 1, some of main via conductors (210, 211, 212, 213) make stacked via conductors, stacked in a straight line in a lamination direction of main wiring board 20, while some make offset via conductors, staggered in a lamination direction of main wiring board 20.

Figure 2:
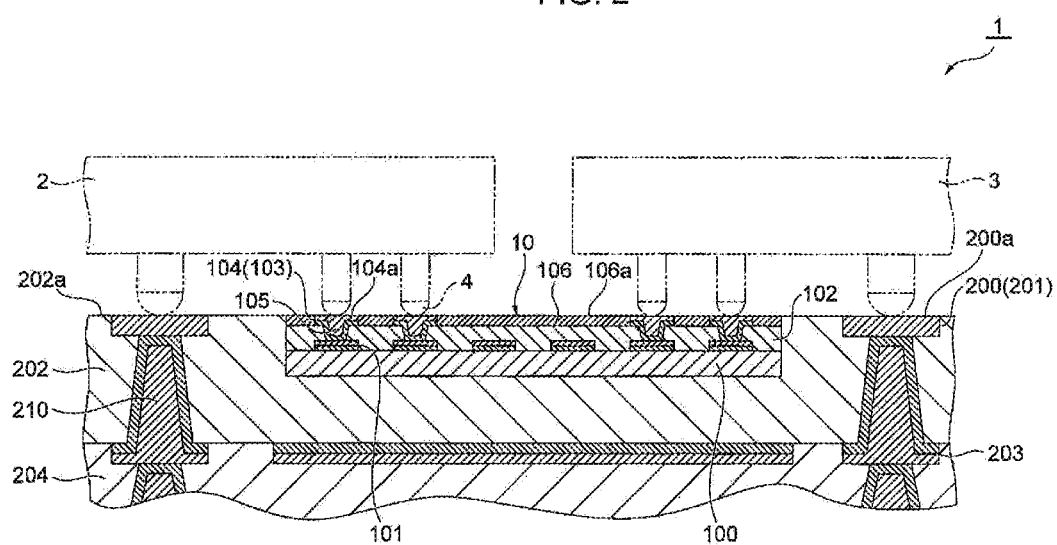
FIG. 2 is an enlarged cross-sectional view showing a wiring structure body in FIG. 1.

Wiring structure body 10 is formed in outermost main insulation layer 202. As shown in FIG. 2, wiring structure body 10 has a cross-sectional rectangular shape and is a three-dimensional rectangle formed with sub-insulation layer 100 positioned on the bottom, sub-conductive layer 101 formed on sub-insulation layer 100, sub-insulation layer 102 covering sub-conductive layer 101, and sub-conductive layer (second conductive layer) 103 formed on sub-insulation layer 102. Sub-conductive layer 103 includes multiple sub-mounting pads (second mounting pads) 104 for mounting MPU 2 and DRAM 3. In the present embodiment, sub-conductive layers (101, 103) are conductive layers dedicated only for signal transmission. Namely, sub-conductive layers (101, 103) include only signal wiring lines.

In the present embodiment, sub-conductive layer 103 of wiring structure body 10 is not connected to main conductive layer 201 of main wiring board 20. Moreover, sub-conductive layer 103 is not connected to main conductive layers (203, 205, 207, 209) of main wiring board 20, either. Namely, wiring structure body 10 and main wiring board 20 are electrically insulated from each other in multilayer wiring board 1. As described later, when MPU 2 and DRAM 3 are mounted on multilayer wiring board 1, MPU 2 and DRAM 3 are electrically connected through wiring structure body 10, sub-conductive layer 103 and main conductive layer 201 will be electrically connected through MPU 2 and DRAM 3.

Sub-insulation layers (100, 102) are made of photosensitive resin. Using photosensitive resin, it is easier to form fine-diameter via holes and high-density wiring patterns in sub-insulation layers. Meanwhile, sub-conductive layers (101, 103) are formed with a seed layer and a copper-plated layer.

As shown in FIG. 2, sub-mounting pads 104 are embedded in adhesive layer 106 in such a way to expose their upper surfaces (104a). Upper surfaces (104a) of sub-mounting pads 104 are made flush with upper surface (106a) of adhesive layer 106. In addition, upper surfaces (104a) of sub-mounting pads 104 are made flush with upper surfaces (200a) of main mounting pads 200 in main wiring board 20.

Multiple sub-via conductors (second via conductors) 105 are formed in sub-insulation layer 102. Sub-via conductors 105 are formed in a truncated-cone shape with a diameter decreasing in a direction away from MPU 2 and DRAM 3. Therefore, the direction of diameters to increase in sub-via conductors 105 is different from that in main via conductors (210, 211, 212, 213) of main wiring board 20. Sub-mounting pads 104 are electrically connected to sub-conductive layer 101 through sub-via conductors 105.

In the present embodiment, wiring density in wiring structure body 10 is set higher than that in main wiring board 20. The wiring widths in sub-conductive layers (101, 103) are 1~5 μm, smaller than the wiring widths in main conductive layers (201, 203, 205, 207, 209). Namely, the L/S (line/space) of wiring lines in sub-conductive layers (101, 103) is smaller than the L/S of wiring lines in main conductive layers (201, 203, 205, 207, 209). The L/S of wiring lines in sub-conductive layers (101, 103) is preferred to be 1 μm/1 μm~5 μm/5 μm. Here, "L" (line) indicates the wiring width, and "S" (space) indicates the interval between wiring lines.

When MPU 2 and DRAM 3 are mounted on multilayer wiring board 1 as structured above, MPU 2 and DRAM 3 are electrically connected through solder bumps 4 to main mounting pads 200 and sub-mounting pads 104. In particular, electrodes of MPU 2 are electrically connected to main mounting pads 200 and sub-mounting pads 104 positioned on either side (in FIGS. 1 and 2, main mounting pads 200 and sub-mounting pads 104 positioned on the left side), whereas electrodes of DRAM 3 are electrically connected to main mounting pads 200 and sub-mounting pads 104 positioned on the other side (in FIGS. 1 and 2, main mounting pads 200 and sub-mounting pads 104 positioned on the right side). By so setting, MPU 2 and DRAM 3 are electrically connected to each other by wiring structure body 10. Although not shown in the drawings, to secure the state of MPU 2 and DRAM 3 mounted on multilayer wiring board 1, underfill resin may be filled in the space between multilayer wiring board 1 and MPU 2 and DRAM 3 mounted on multilayer wiring board 1.

In multilayer wiring board 1 having the above structure, no core substrate is used in main wiring board 20, and main via conductors (210, 211, 212, 213) are set to have diameters increasing in the same direction. Accordingly, via holes can be formed in main insulation layers (202, 204, 206, 208) from the same direction so that main via conductors (210, 211, 212, 213) in main wiring board 20 are all formed from one direction. Besides, the space for a core substrate is spared, making multilayer wiring board 1 thinner. In addition, multilayer wiring board 1 does not need the space for a core substrate and is manufactured by a coreless method. Accordingly, compared with a multilayer wiring board 1 with a core substrate, more options are available when selecting a laser for forming via holes, interlayer insulating resin material or the like. As a result, the cost of forming multilayer wiring board 1 is reduced.

In addition, since main via conductors (210, 211, 212, 213) are set to have diameters increasing in a direction away from MPU 2 and DRAM 3, the area contributing to heat dissipation is greater, compared with via conductors set to have diameters decreasing in a direction away from MPU 2 and DRAM 3. Thus, heat generated in MPU 2 and DRAM 3 mounted on main wiring board 20 is efficiently dissipated. Accordingly, stable operations of MPU 2 and DRAM 3 are secured.

In addition, since upper surfaces (200a) of main mounting pads 200 are made flush with upper surface (202a) of outermost main insulation layer 202, the mounting surface for MPU 2 and DRAM 3 is made flat, thus improving mounting yield. Moreover, since upper surfaces (200a) of main mounting pads 200 are made flush with upper surface (202a) of outermost main insulation layer 202, the self-alignment effect is obtained when mounting MPU 2 and DRAM 3, thus securely preventing formation of solder bridges. As a result, connection reliability when mounting MPU 2 and DRAM 3 is enhanced.

Furthermore, since sub-conductive layer 103 of wiring structure body 10 is not connected to, but is electrically insulated from, main conductive layer 201 of main wiring board 20, there is no need to provide circuits for electrically connecting sub-conductive layer 103 and main conductive layer 201, thus simplifying the circuit structure of multilayer wiring board 1. In addition, the direction of diameters to increase in sub-via conductors 105 is different from that in main via conductors (210, 211, 212, 213) of main wiring board 20, mitigating thermal stress caused by differences in thermal expansion coefficients of wiring structure body 10 and main wiring board 20. Accordingly, warping or cracking caused by thermal stress is prevented. Therefore, the reliability of multilayer wiring board 1 is enhanced.

Yet furthermore, since upper surfaces (200a) of main mounting pads 200 are made flush with upper surfaces (104a) of sub-mounting pads 104, solder bumps with the same height are formed on those mounting pads for mounting MPU 2 and DRAM 3, making it easier for mounting MPU 2 and DRAM 3 and enhancing their mounting yield. In addition, since upper surfaces (104a) of sub-mounting pads 104 are made flush with upper surface (106a) of insulation layer 106, sub-mounting pads 104 are prevented from peeling off, and the self-alignment effect is obtained when mounting electronic components, thus suppressing formation of solder bridges.

In multilayer wiring board 1 of the present embodiment, upper surfaces (200a) of main mounting pads 200 and upper surfaces (104a) of sub-mounting pads 104 may be roughened if desired. For example, the upper surfaces may be roughened by etching. By roughening the surfaces, adhesiveness is enhanced between main mounting pads 200 and solder bumps 4 and between sub-mounting pads 104 and solder bumps 4, and mounting failure is thereby prevented when electronic components are mounted.

Yet furthermore, surface-treatment film may be formed on upper surfaces (200a) of main mounting pads 200 and upper surfaces (104a) of sub-mounting pads 104. Examples of surface-treatment film are electroless Ni/Pd/Au film, electroless Ni/Au film, OSP (organic solderability preservative) film and the like. Forming such surface-treatment film prevents an increase in contact resistance caused by oxidation of upper surfaces (200a) of main mounting pads 200 and upper surfaces (104a) of sub-mounting pads 104.

A method for manufacturing multilayer wiring board 1 is described below. The method for manufacturing multilayer wiring board 1 according to the present embodiment includes a method for manufacturing wiring structure body 10 and a method for manufacturing multilayer wiring board 1 by embedding wiring structure body 10 in main wiring board 20 and by laminating layers thereon. First, a method for manufacturing wiring structure body 10 is described with reference to FIG. 3A-3H.

Method for Manufacturing Wiring Structure Body

Figure 3A:
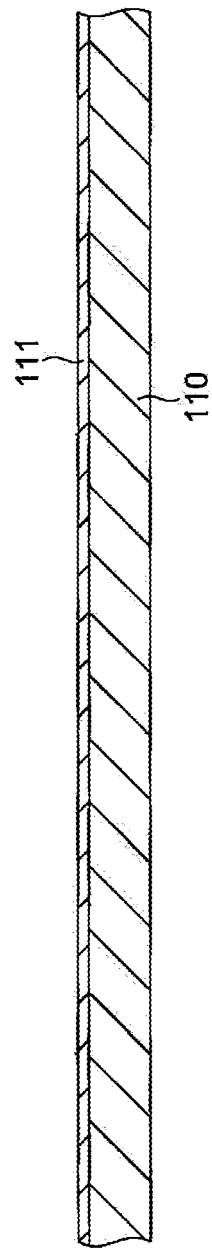
FIG. 3A is a view showing a process in a method for manufacturing a wiring structure body.

First, support plate 110 is prepared. Support plate 110 is a flat-surface glass plate with a low thermal expansion coefficient, for example. However, that is not the only option as the material for support plate 110; for example, Si, metallic plate or the like may also be used. Next, release layer 111 is formed on support plate 110 (FIG. 3A). An example of a release agent used for release layer 111 is WaferBOND, made by Brewer Science, Inc. Next, sub-insulation layer 100 made of resin is formed on release layer 111. Sub-insulation layer 100 is formed by coating and heating an insulative material made of photosensitive polyimide resin, for example. Then, heat is applied on release layer 111 and sub-insulation layer 100 so as to adhere them.

Figure 3B:
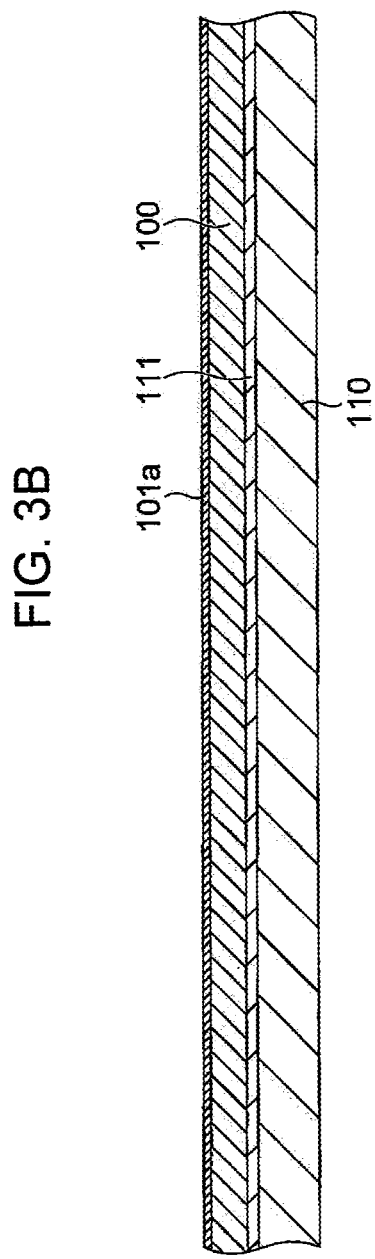
FIG. 3B is a view showing a process in the method for manufacturing a wiring structure body.

Next, sub-conductive layer 101 is formed on sub-insulation layer 100 by using a semi-additive process (SAP). In particular, seed layer (101a) is formed on sub-insulation layer 100 (FIG. 3B). Seed layer (101a) is formed by sputtering, for example. The material for seed layer (101a) is titanium, titanium nitride, chromium, copper or the like. A predetermined resist pattern 112 is formed on seed layer (101a). More specifically, a photosensitive resist material is coated on seed layer (101a), and exposed to light and developed to form predetermined resist pattern 112 (FIG. 3C).

Figure 3D:
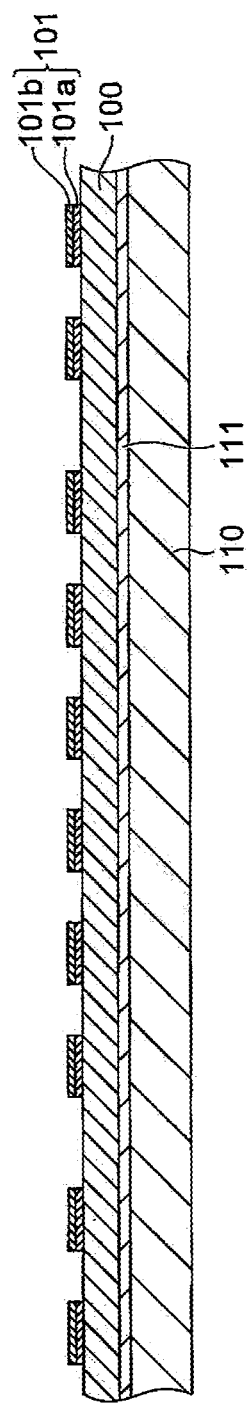
FIG. 3D is a view showing a process in the method for manufacturing a wiring structure body.

On seed layer (101a) without resist pattern 112, copper-plated layer (101b) is formed. Here, copper-plated layer (101b) may be an electroless plated layer, electrolytic plated layer, or laminated layer of electroless and electrolytic plated layers. Next, predetermined resist pattern 112 is removed from seed layer (101a). Then, portions of seed layer (101a) exposed from resist pattern 112 are etched. Sub-conductive layer 101 is formed with seed layer (101a) and copper-plated layer (101b) remaining on sub-insulation layer 100 (FIG. 3D).

Figure 3F:
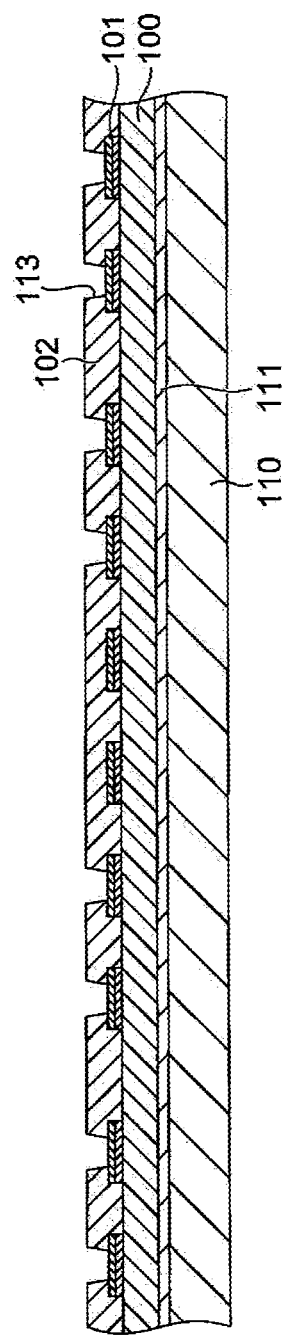
FIG. 3F is a view showing a process in the method for manufacturing a wiring structure body.

Sub-insulation layer 102 is formed to cover sub-conductive layer 101 and sub-insulation layer 100 (FIG. 3E). The same as sub-insulation layer 100, sub-insulation layer 102 is formed by coating and heating insulative material made of photosensitive polyimide resin. Then, using a mask with openings formed in predetermined positions, sub-insulation layer 102 is exposed to light and developed so as to form via holes 113 at specified positions (FIG. 3F).

Sub-via conductors 105 and sub-conductive layer 103 are formed. In particular, a seed layer is formed by sputtering on sub-insulation layer 102 and on the inner-wall surfaces and bottom surfaces of via holes 113. Then, a predetermined resist pattern is formed on the seed layer using the aforementioned process, a copper-plated layer is formed on the seed layer without the resist pattern formed thereon, and the resist pattern is then removed. The seed layer exposed by the removal of the resist pattern is etched so as to form sub-conductive layer 103 made up of the seed layer and copper-plated layer on sub-insulation layer 102. Sub-conductive layer 103 includes multiple sub-mounting pads 104 for mounting MPU 2 and DRAM 3.

Figure 3G:
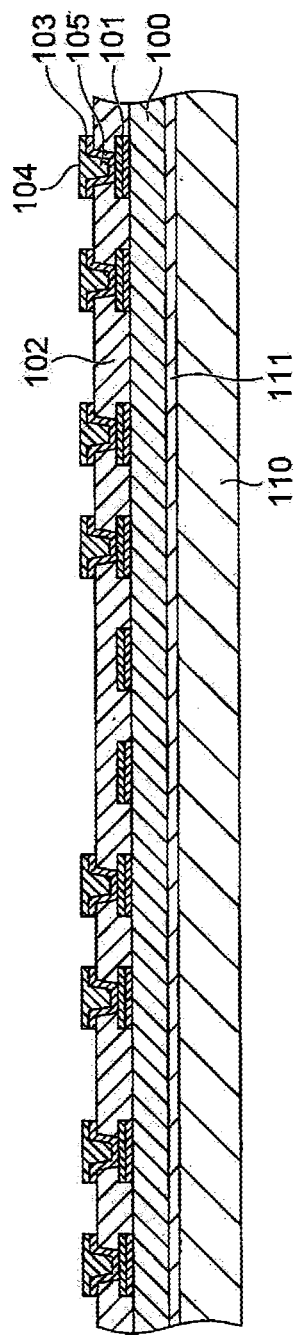
FIG. 3G is a view showing a process in the method for manufacturing a wiring structure body.
Figure 3H:
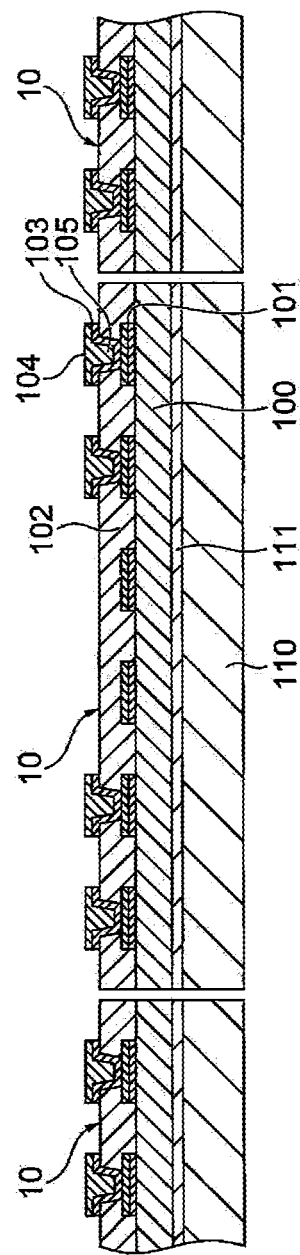
FIG. 3H is a view showing a process in the method for manufacturing a wiring structure body.

In addition, when the copper-plated layer is formed, via holes 113 are filled with copper, and the filled copper forms sub-via conductors 105 (FIG. 3G). Then, from the side where sub-conductive layer 103 is formed, the intermediate substrate is cut along predetermined cut lines so that individual wiring bodies 10 are obtained (FIG. 3H).

Figure 4A:
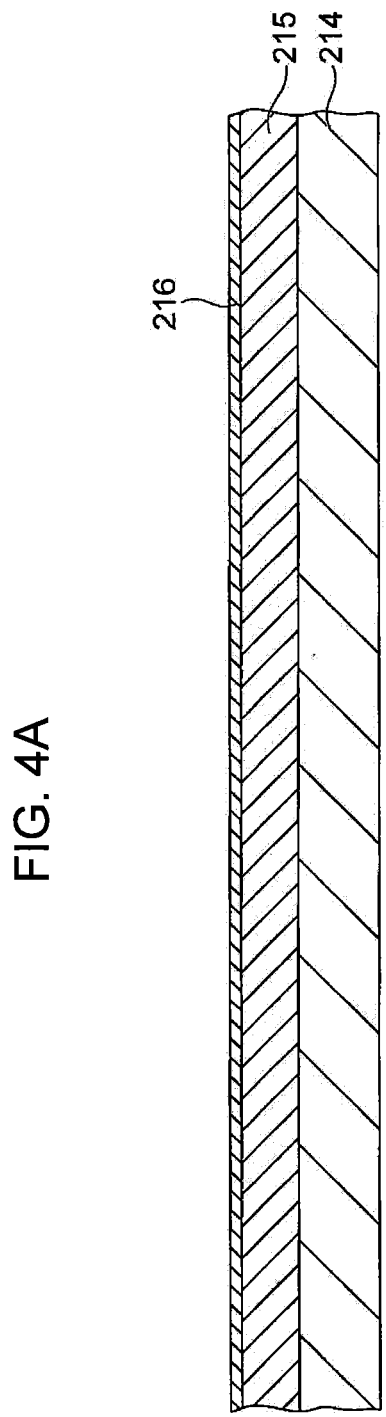
FIG. 4A is a view showing a process in a method for manufacturing a multilayer wiring board.

Method for Manufacturing Multilayer Wiring Board by Embedding Wiring Structure Body in Main Wiring Board and Building Up Layers By referring to FIG. 4A-4O, the following describes a method for manufacturing multilayer wiring board 1 by embedding wiring structure body 10 in main wiring board 20 and then conducting lamination procedures. When wiring structure body 10 is embedded in main wiring board 20 and layers are laminated thereon, sub-conductive layer 103 of wiring structure body 10 and main conductive layer 201 of main wiring board 20 are set to be insulated from each other.

Figure 4B:
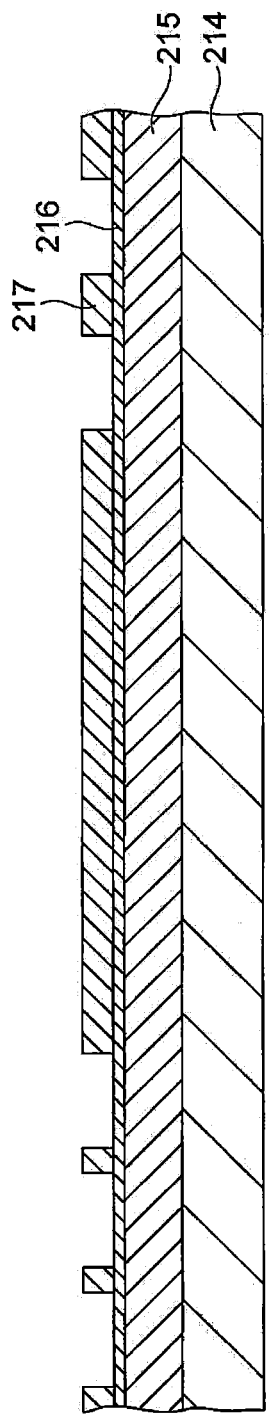
FIG. 4B is a view showing a process in the method for manufacturing a multilayer wiring board.

First, support plate 214 with carrier copper foil 215 is prepared. As for support plate 214, an epoxy resin substrate with a glass-cloth core (prepreg with a core material) or the like may be used. Next, main conductive layer 201 having multiple main mounting pads 200 is formed on support plate 214. In particular, copper foil 216 is formed on support plate 214 (FIG. 4A). Then, photosensitive dry film is laminated on a surface of copper foil 216. A mask film with a predetermined pattern is adhered on the photosensitive dry film, which is exposed to ultraviolet rays and then developed using an alkaline solution. Accordingly, predetermined resist pattern 217 is formed (FIG. 4B).

Figure 4C:
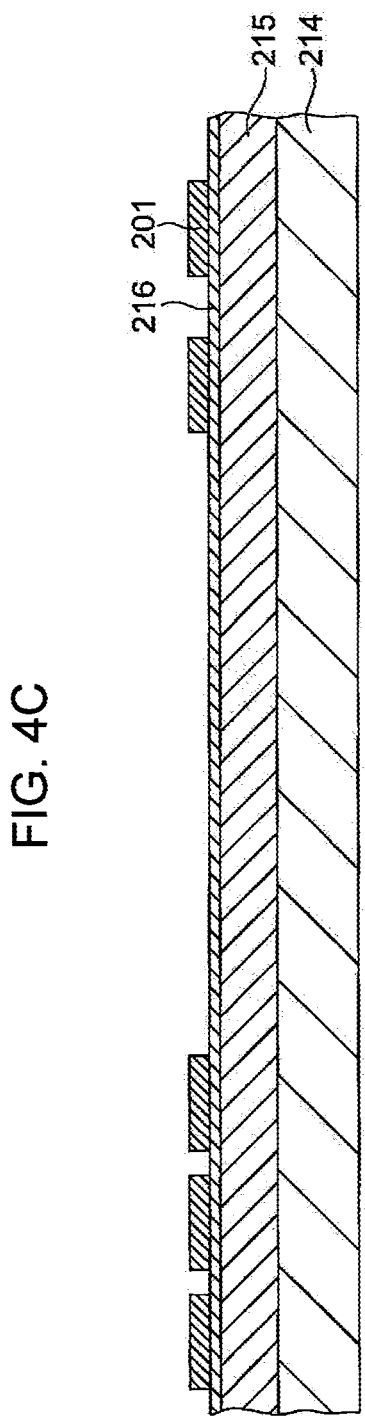
FIG. 4C is a view showing a process in the method for manufacturing a multilayer wiring board.

Next, electrolytic plating is performed on the upper surface of copper foil 216 to form a plated film. Then, using a solution containing monoethanolamine, resist pattern 217 is removed. Accordingly, main conductive layer 201 is formed on the upper surface of copper foil 216 (FIG. 4C). Main conductive layer 201 includes multiple main mounting pads 200 for mounting electronic components. Next, an adhesive agent is coated on the upper surface of copper foil 216 on support plate 214 so that adhesive layer 106 is formed. For example, an epoxy-resin-based, acrylic-resin-based, or silicone-resin-based adhesive agent may be used. Adhesive layer 106 is formed to have substantially the same size as that of wiring structure body 10.

Wiring structure body 10 is fixed onto support plate 214 with sub-mounting pads 104 of wiring structure body 10 facing downward. Namely, wiring structure body 10 is placed on the upper surface of adhesive layer 106 with sub-mounting pads 104 facing downward so that wiring structure body 10 is fixed to copper foil 216 on support plate 214 through adhesive layer 106 (FIGS. 4D and 4E). Accordingly, sub-via conductors 105 of wiring structure body 10 are set with the diameters increasing toward support plate 214. In addition, since sub-mounting pads 104 are adhered to adhesive layer 106, the adhesive agent is filled between adjacent sub-mounting pads 104 without leaving any gaps.

Figure 4F:
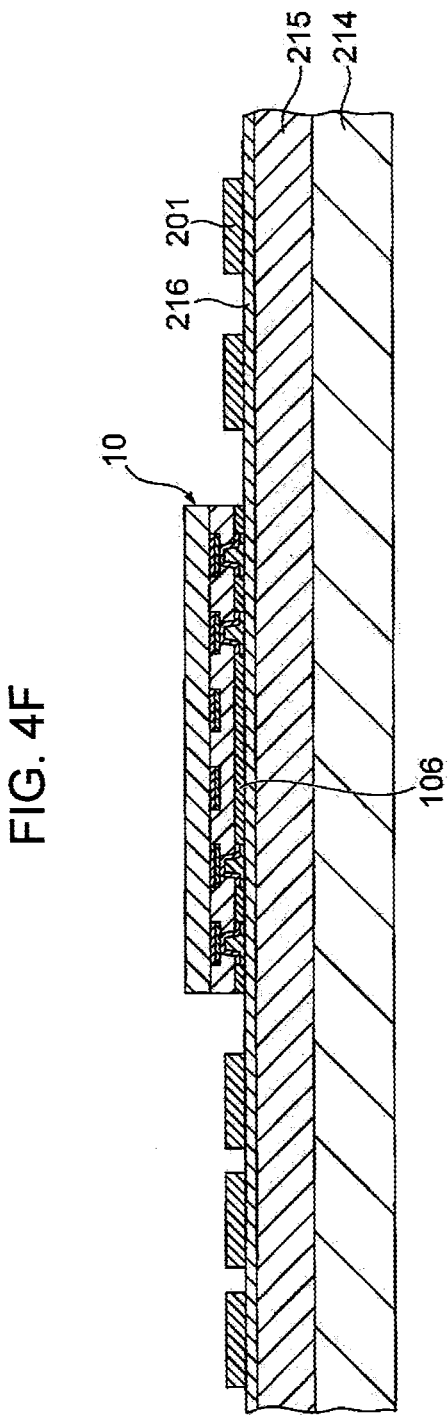
FIG. 4F is a view showing a process in the method for manufacturing a multilayer wiring board.

Support plate 110 integrated with wiring structure body 10 is peeled by applying heat, for example, on wiring structure body 10 and support plate 110 to soften release layer 111 so that wiring structure body 10 and support plate 110 are separated. After support plate 110 is separated, the release agent remaining on wiring structure body 10 is completely removed (FIG. 4F).

Figure 4G:
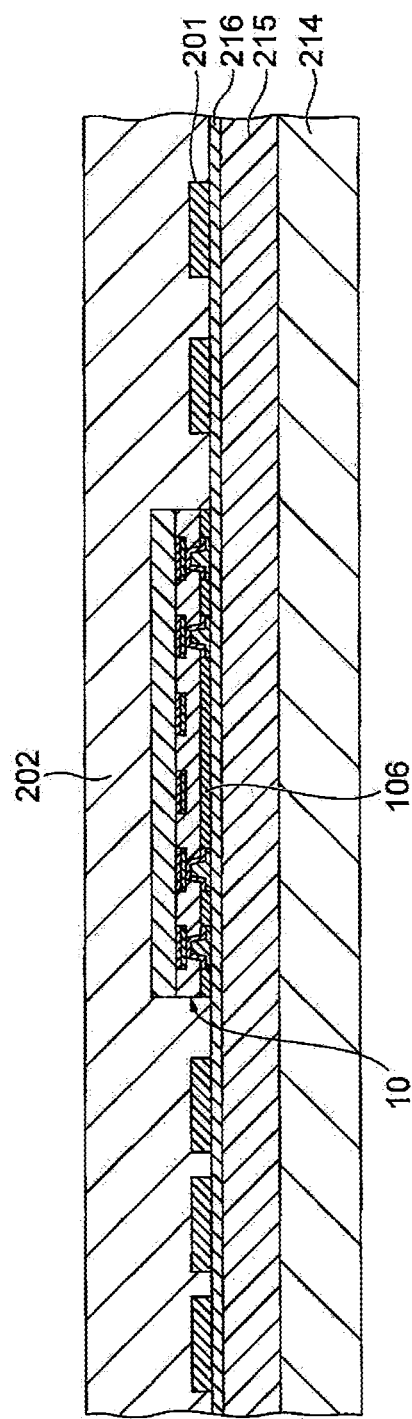
FIG. 4G is a view showing a process in the method for manufacturing a multilayer wiring board.
Figure 4H:
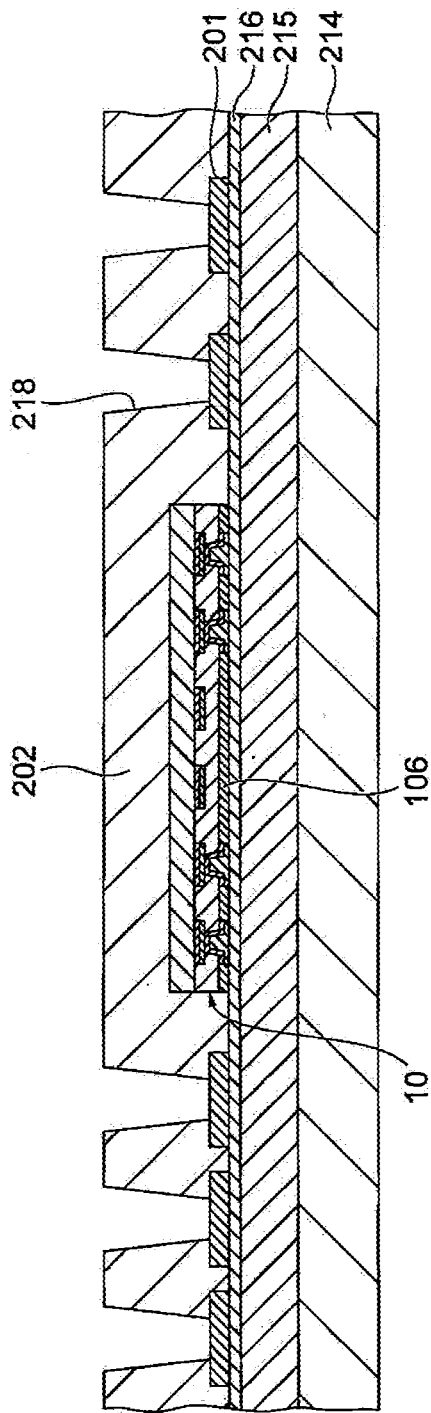
FIG. 4H is a view showing a process in the method for manufacturing a multilayer wiring board.

Main insulation layer 202 is formed on copper foil 216 to cover main conductive layer 201 and wiring structure body 10 (FIG. 4G). The material for forming main insulation layer 202 is thermosetting epoxy resin, for example. Next, a $CO_2$ laser is irradiated on main insulation layer 202 to form multiple via holes 218 (FIG. 4H). Desmearing is performed to remove residue remaining in via holes 218 after the formation of via holes. Via holes 218 are formed to have diameters decreasing toward support plate 214. Thus, main via conductors formed in via holes 218 are set to have diameters decreasing toward support plate 214.

Figure 4I:
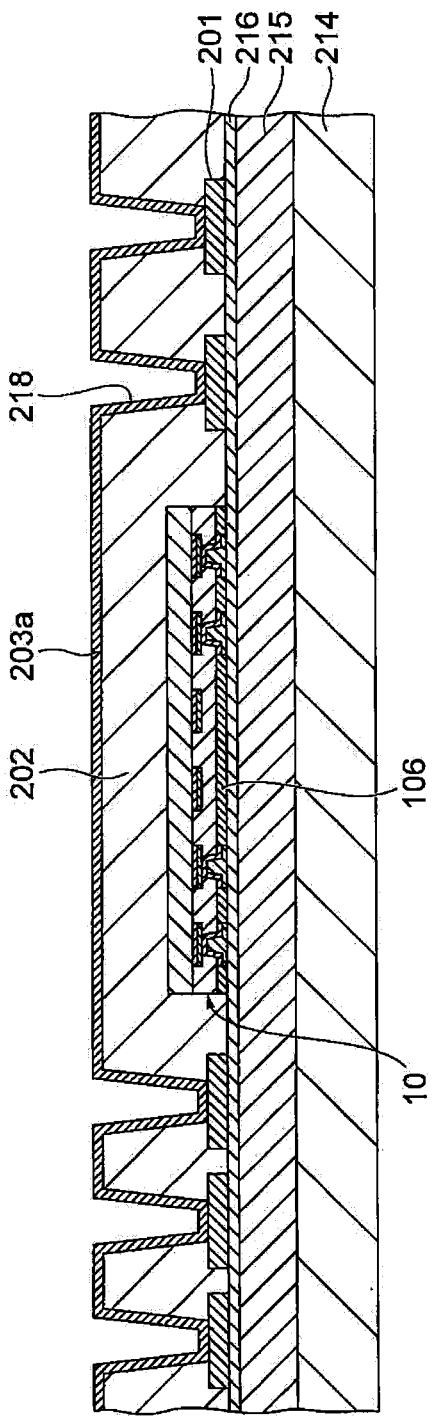
FIG. 4I is a view showing a process in the method for manufacturing a multilayer wiring board.

Support plate 214 with main insulation layer 202 is immersed in a catalyst mainly containing palladium or the like so that a catalyst is attached on the surface of main insulation layer 202. Then, support plate 214 is immersed in an electroless copper-plating solution. Accordingly, electroless plated film (203a) is formed on the surface of main insulation layer 202 and on the inner walls of via holes 218 (FIG. 4I). Copper, nickel or the like is used for forming electroless plated film.

Figure 4J:
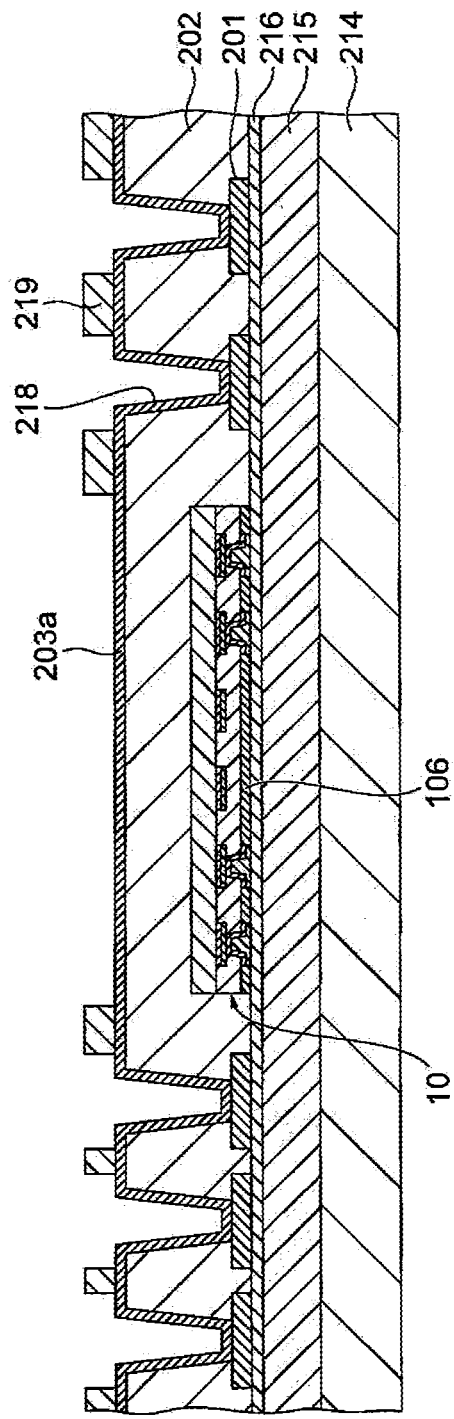
FIG. 4J is a view showing a process in the method for manufacturing a multilayer wiring board.

Photosensitive dry film is laminated on the surface of electroless plated film (203a). After a mask film with a predetermined pattern is adhered to the photosensitive dry film, the dry film is exposed to ultraviolet rays and developed using an alkaline solution. Accordingly, predetermined resist pattern 219 is formed (FIG. 4J).

Figure 4K:
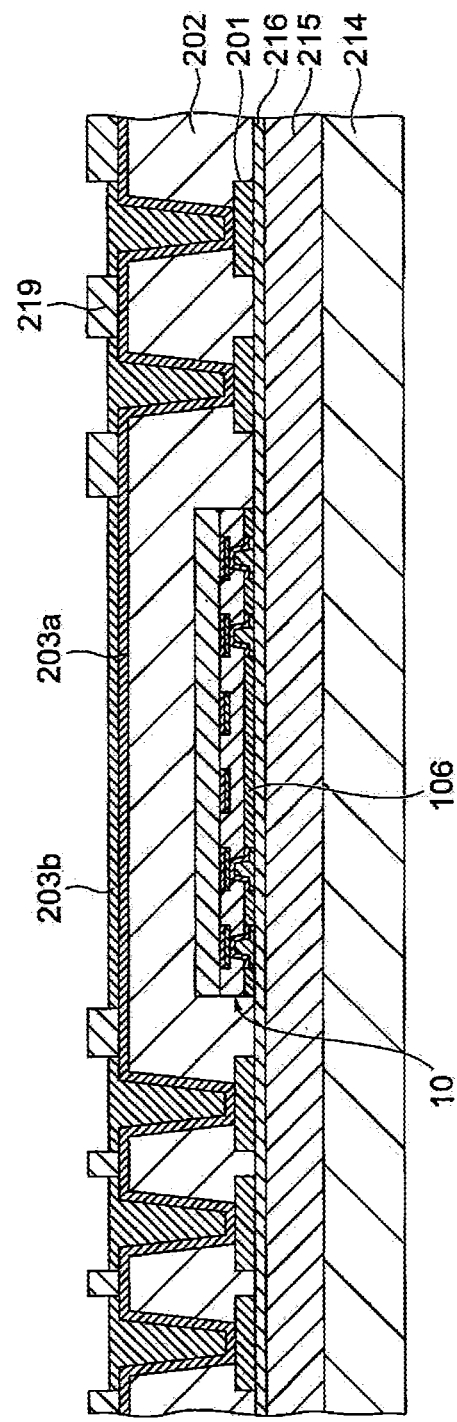
FIG. 4K is a view showing a process in the method for manufacturing a multilayer wiring board.
Figure 4L:
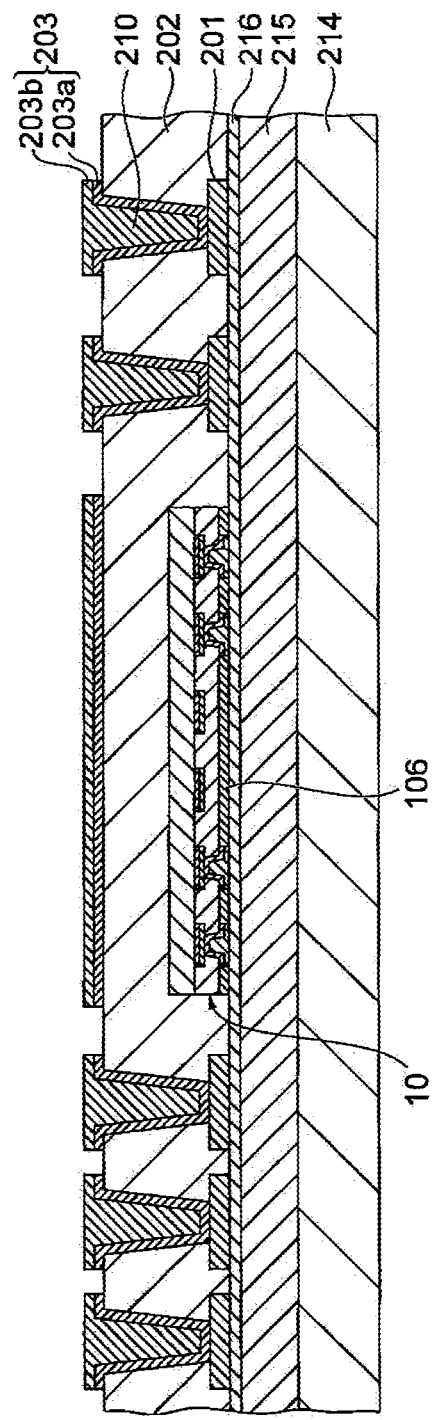
FIG. 4L is a view showing a process in the method for manufacturing a multilayer wiring board.

Using electroless plated layer (203a) as a seed layer, electrolytic plated layer (203b) is formed thereon (FIG. 4K). Then, resist pattern 219 is removed, and electroless plated film (203a) covered by resist pattern 219 is etched. Accordingly, main conductive layer 203 is formed with electroless plated layer (203a) and electrolytic plated layer (203b) remaining on main insulation layer 202. Via holes 218 are filled with electrolytic plating material to form main via conductors 210 (FIG. 4L).

Figure 4M:
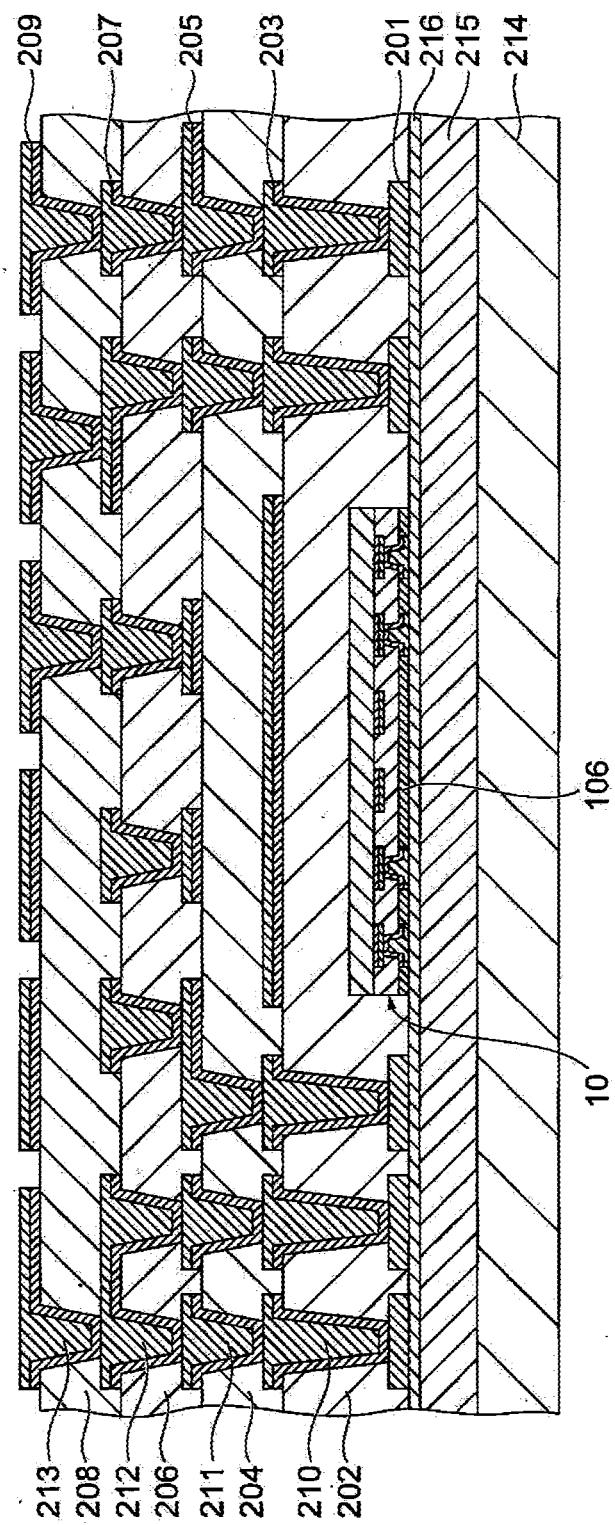
FIG. 4M is a view showing a process in the method for manufacturing a multilayer wiring board.

By repeating the above procedures, main insulation layer 204, main conductive layer 205, main via conductors 211, main insulation layer 206, main conductive layer 207, main via conductors 212, main insulation layer 208, main conductive layer 209, and main via conductors 213 are formed in that order. Accordingly, multilayer wiring board 1 is formed on support plate 214 (FIG. 4M).

Figure 4N:
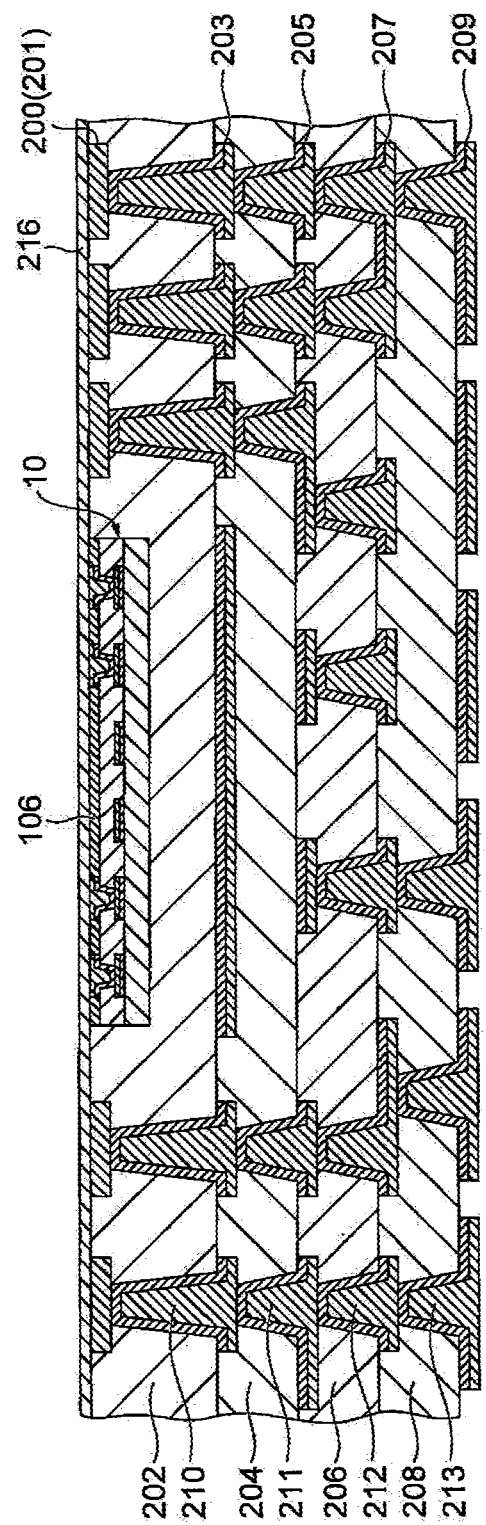
FIG. 4N is a view showing a process in the method for manufacturing a multilayer wiring board.

After support plate 214 and carrier copper foil 215 are removed from multilayer wiring board 1, multilayer wiring board 1 is vertically inverted (FIG. 4N). Then, copper foil 216 is removed by etching. Subsequently, main mounting pads 200, which are portions of main conductive layer 201, are exposed. Then, etching is performed so that upper surfaces (200a) of main mounting pads 200 are made flush with upper surface (202a) of main insulation layer 202.

A $CO_2$ laser is irradiated to remove adhesive layer 106 so that upper surfaces (104a) of sub-mounting pads 104 are exposed. Accordingly, sub-mounting pads 104, which are portions of sub-conductive layer 103, are exposed. Next, etching is performed so that upper surfaces (200a) of main mounting pads 200 are made flush with upper surfaces (104a) of sub-mounting pads 104. Moreover, adhesive layer 106 is removed so that upper surface (106a) of adhesive layer 106 is made flush with upper surfaces (104a) of sub-mounting pads 104.

If applicable, upper surfaces (200a) of main mounting pads 200 and upper surfaces (104a) of sub-mounting pads 104 are roughened or surface-treatment film is formed thereon. Also, a solder-resist layer may be formed to cover upper surface (202a) of main insulation layer 202 and upper surface (106a) of adhesive layer 106 while exposing main mounting pads 200 and sub-mounting pads 104. Subsequently, procedures for forming multilayer wiring board 1 is completed (FIG. 4O).

According to the aforementioned manufacturing method, main wiring board 20 does not need to have a core substrate, and is manufactured by using a coreless method. Thus, more options for selecting a laser for forming via holes, interlayer resin insulating material or the like are available, compared with forming a multilayer wiring board with a core substrate. Accordingly, cost reduction is more easily achieved for forming multilayer wiring board 1. In addition, via holes can be formed in main insulation layers (202, 204, 206, 208) from the same direction, that is, main via conductors (210, 211, 212, 213) are formed from the same direction when manufacturing main wiring board 20. Moreover, since there is no need to have a core substrate in main wiring board 20, multilayer wiring board 1 is made thinner.

Furthermore, the direction of diameters to increase in sub-via conductors 105 of wiring structure body 10 is different from that in main via conductors (210, 211, 212, 213) of main wiring board 20, thereby mitigating thermal stress caused by different thermal expansion coefficients of wiring structure body 10 and main wiring board 20. Accordingly, warping and cracking caused by thermal stress are prevented.

Figure 5A:
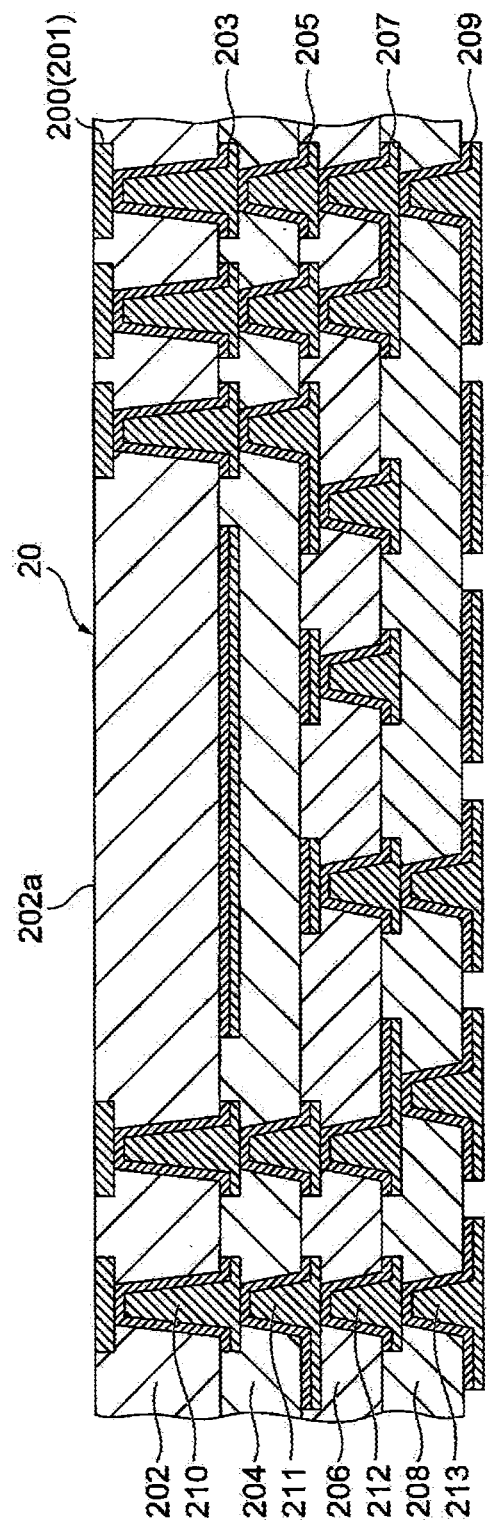
FIG. 5A is a view showing a process in another method for manufacturing a multilayer wiring board.
Figure 5B:
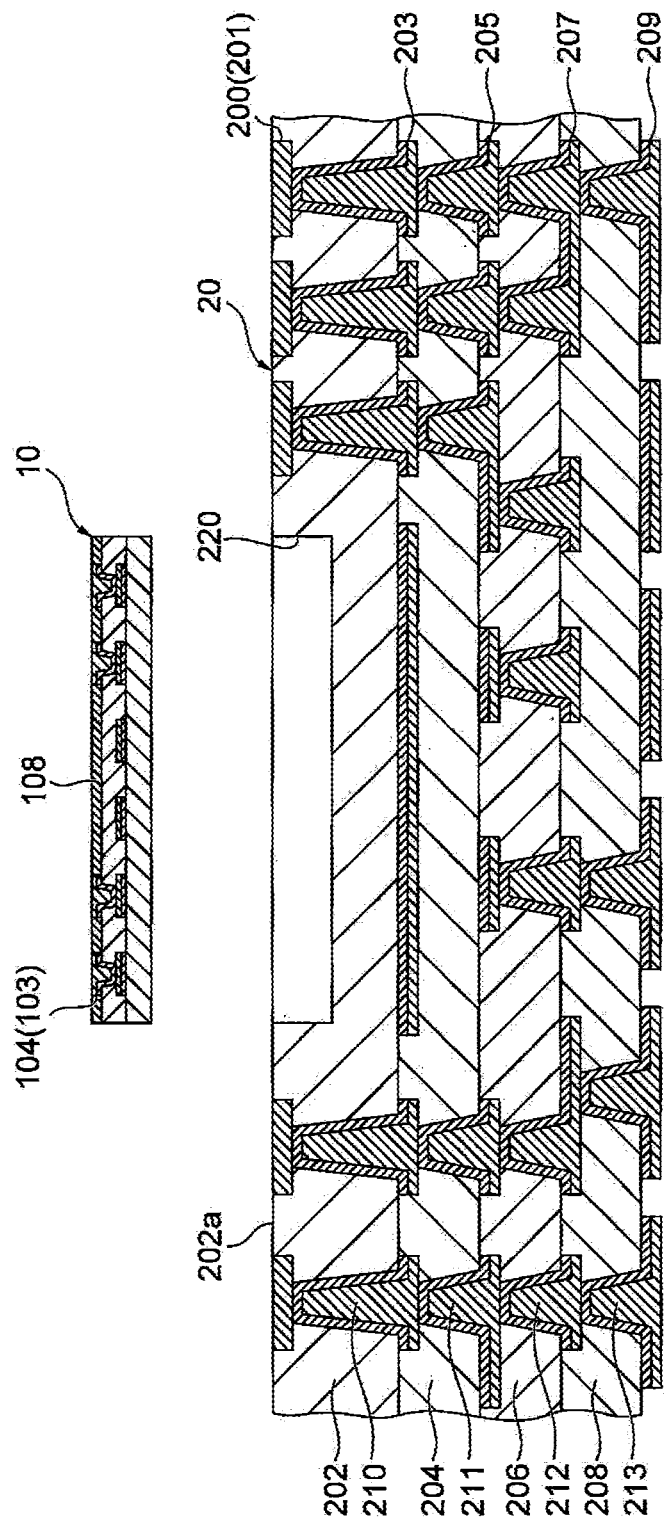
FIG. 5B is a view showing a process in the other method for manufacturing a multilayer wiring board.
Figure 5C:
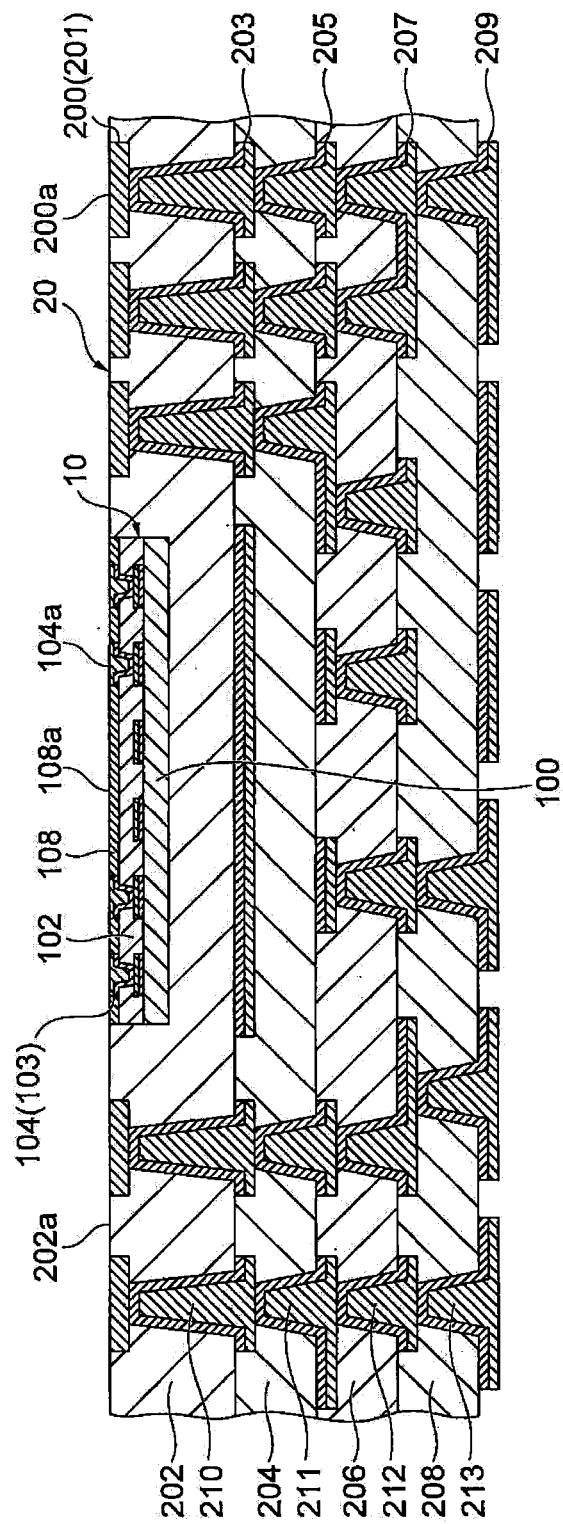
FIG. 5C is a view showing a process in the other method for manufacturing a multilayer wiring board.

Multilayer wiring board 1 of the present embodiment is not limited to being formed as above. For example, as shown in FIG. 5A-5C, a recess is formed in a main wiring board and a wiring structure body may be accommodated in the recess. More specifically, first, main wiring board 20 is formed by a lamination method described above (FIG. 5A). Namely, main wiring board 20 is formed to have main insulation layers (202, 204, 206, 208), main conductive layer 201 including multiple main mounting pads 200, main conductive layers (203, 205, 207, 209), and main via conductors (210, 211, 212, 213).

Next, recess 220 for accommodating wiring structure body 10 is formed from the upper-surface (202a) side of main insulation layer 202 (FIG. 5B). Then, wiring structure body 10 is accommodated in recess 220 and is fixed to wiring board 20 (FIG. 5C). Wiring structure body 10 is placed in recess 220 in such a way that the direction of diameters to increase in the sub-via conductors of wiring structure body 10 is different from that in main via conductors (210, 211, 212, 213) of main wiring board 20, while main conductive layer 201 and sub-conductive layer 103 are insulated from each other. Here, instead of adhesive layer 106, sub-insulation layer 108 may be filled among sub-mounting pads 104. Sub-insulation layer 108 is made of a photosensitive resin the same as sub-insulation layers (100, 102). Upper surface (108a) of sub-insulation layer 108 is made flush with upper surfaces (104a) of sub-mounting pads 104. Then, using the above manufacturing method, multi-layer wiring board 1 of the first embodiment is also completed.

In the procedures shown in FIG. 5A-5C, main conductive layer 201 of main wiring board 20 and sub-conductive layer 103 of wiring structure body 10 are insulated from each other (namely, they are not electrically connected). In the procedures described with reference to FIG. 6A-6C, a main conductive layer and a sub-conductive layer will be electrically connected.

In multilayer wiring board 14 shown in FIG. 6C, wiring structure body 12 is different from above wiring structure body 10 in that wiring structure body 12 does not include sub-insulation layer 100, and sub-insulation layer 108 instead of adhesive layer 106 is filled among sub-mounting pads 104. Sub-insulation layer 108 is made of photosensitive resin the same as sub-insulation layer 102. Upper surface (108a) of sub-insulation layer 108 is made flush with upper surfaces (104a) of sub-mounting pads 104. Lower surface (101a) of sub-conductive layer 101 is exposed on the opposite side of sub-mounting pads 104. Lower surface (101a) of sub-conductive layer 101 is made flush with lower surface (102a) of sub-insulation layer 102. Portions of exposed sub-conductive layer 101 make multiple pads 117 for connection with main conductive layer 221 of main wiring board 21. Meanwhile, main wiring board 21 is different from the above main wiring board 20 in that multiple pads 223 for connection with pads 117 of wiring structure body 12 are formed inside main wiring board 21. The rest of the structure of main wiring board 21 is the same as that of main wiring board 20. Pads 223 are portions of main conductive layer 221, and are bonded to pads 117 of main wiring structure body 12 through solder 13. Accordingly, pads 223 of main wiring board 21 are electrically connected to pads 117 of wiring structure body 12. As shown in FIG. 6C, some of pads 117 of wiring structure body 12, which are electrically connected to pads 223 of main wiring board 21, are further electrically connected to outermost main conductive layer 209 of main wiring board 21 by way of main via conductors 211, main conductive layer 205, main via conductors 212, main conductive layer 207, and main via conductors 213. By so setting, some of the wiring circuits in wiring structure body 12 work as power-source or ground circuits.

When multilayer wiring board 14 is manufactured to have a structure as above, main wiring board 21 is first formed by the aforementioned lamination method used for main wiring board 20 (FIG. 6A). Namely, main wiring board 21 is formed to have main insulation layers (202, 204, 206, 208), main conductive layer 201 including multiple main mounting pads 200, main conductive layers (221, 205, 207, 209) and main via conductors (210, 211, 212, 213). Main conductive layer 221 is made up of an electroless-plated layer and electrolytic plated layer, the same as conductive layers (205, 207, 209).

Figure 6B:
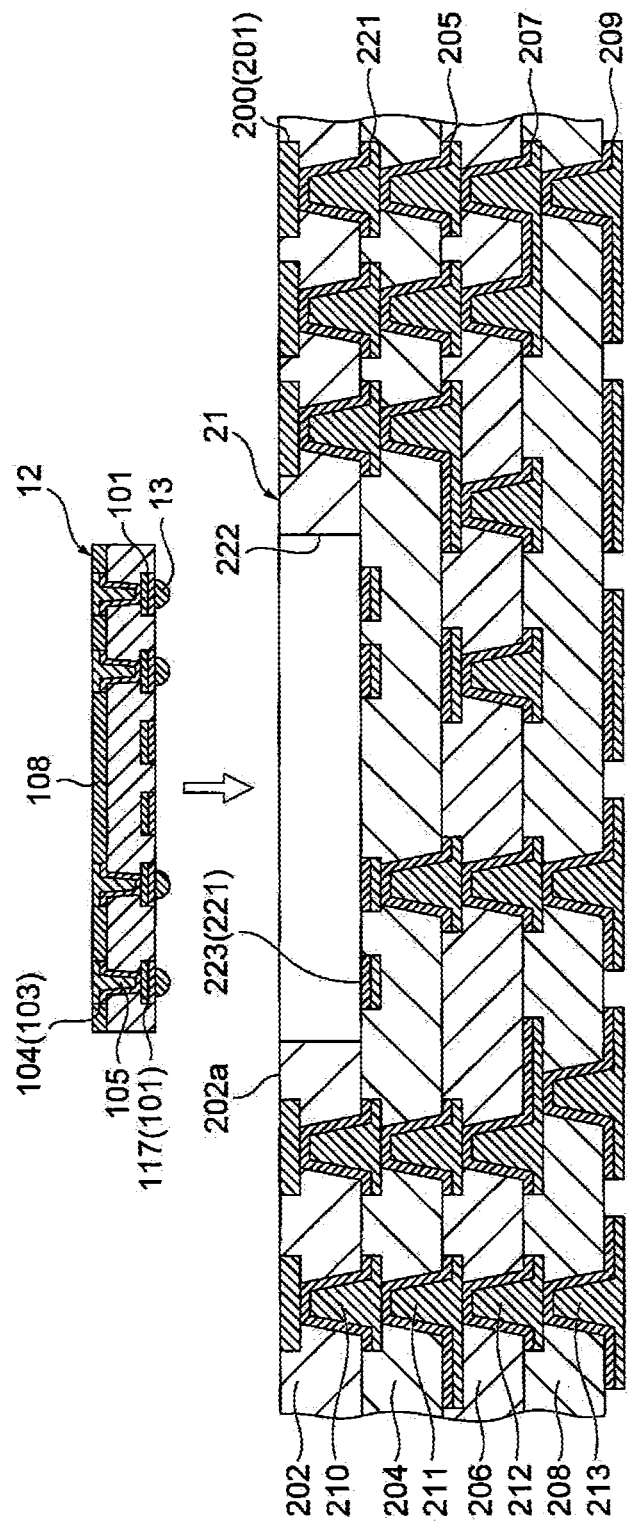
FIG. 6B is a view showing a process in still yet another method for manufacturing a multilayer wiring board.

Next, recess 222 to accommodate wiring structure body 12 is formed from the upper-surface (202a) side of main insulation layer 202. When recess 222 is formed, pads 223 covered by main insulation layer 202 become exposed (FIG. 6B). Next, wiring structure body 12 formed beforehand is accommodated in recess 222 and solder-bonded to main wiring board 21. In particular, wiring structure body 12 having pads 117 coated with solder 13 is placed in recess 222 in such a way that pads 117 of wiring structure body 12 are aligned with pads 223 of main wiring board 21. Then, by heating solder 13, pads 117 of wiring structure body 12 are bonded to pads 223 of main wiring board 21. Accordingly, multilayer wiring board 14 is completed (FIG. 6C). Here, solder 13 may be coated on pads 223 exposed when recess 222 is formed, and then wiring structure body 12 may be solder-bonded to main wiring board 21.

Second Embodiment

Figure 7:
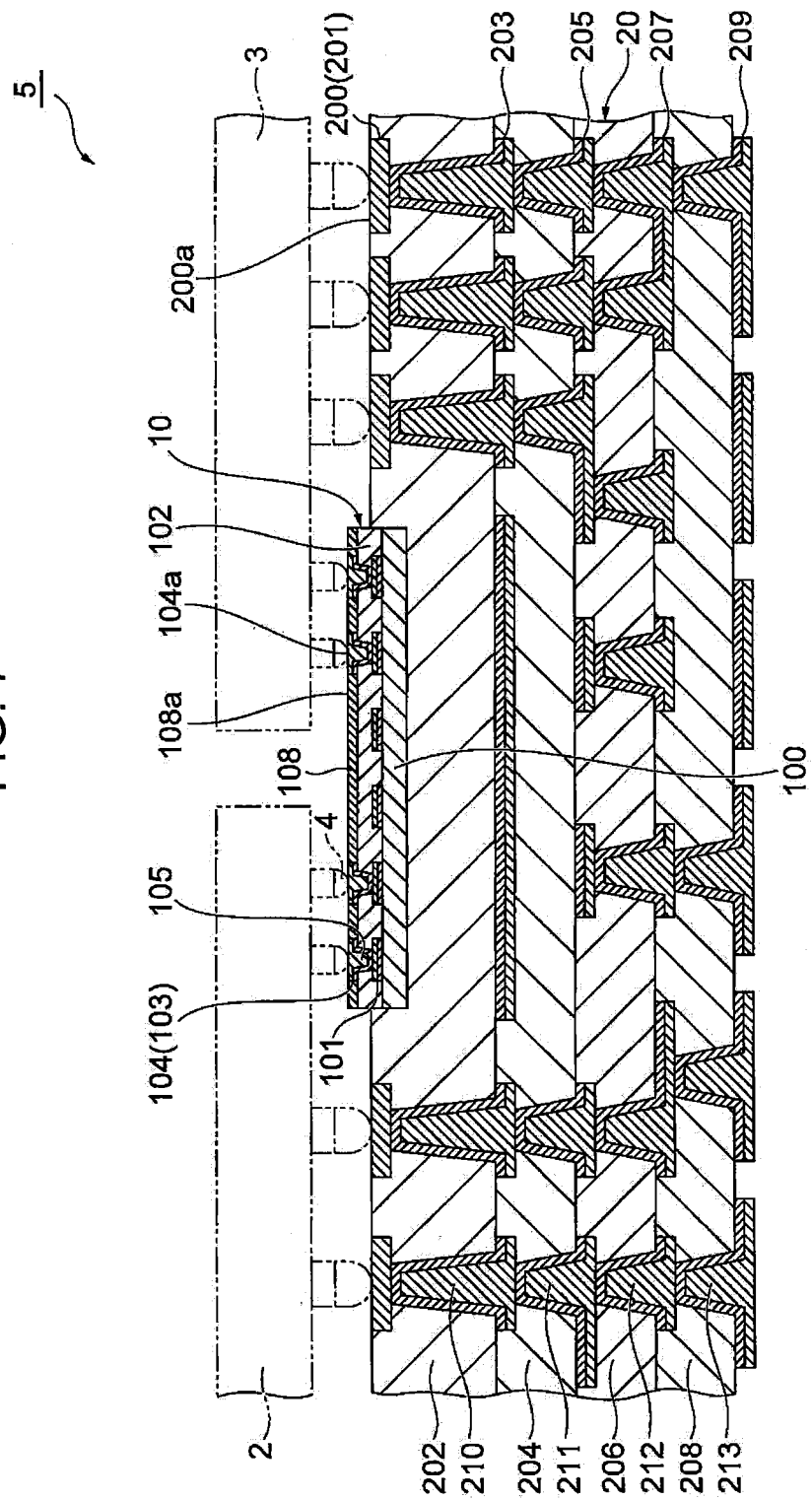
FIG. 7 is a cross-sectional view showing part of a multilayer wiring board according to a second embodiment.

A second embodiment of the present invention is described below by referring to FIG. 7. Multilayer wiring board 5 of the present embodiment is different from the first embodiment in that wiring structure body 10 is set to protrude from main wiring board 20, but the rest of the structure is the same as that in the first embodiment.

More specifically, upper surfaces (104a) of sub-mounting pads 104 in wiring structure body 10 are not made flush with upper surfaces (200a) of main mounting pads 200 in main wiring board 20, but are set to be positioned higher than upper surfaces (200a). Sub-insulation layer 108 made of photosensitive resin is filled among sub-mounting pads 104. Upper surface (108a) of sub-insulation layer 108 is made flush with upper surfaces (104a) of sub-mounting pads 104. Since the rest of multilayer wiring board 5 of the present embodiment is structured the same as in the first embodiment, the same effects described above are achieved.

Third Embodiment

Figure 8:
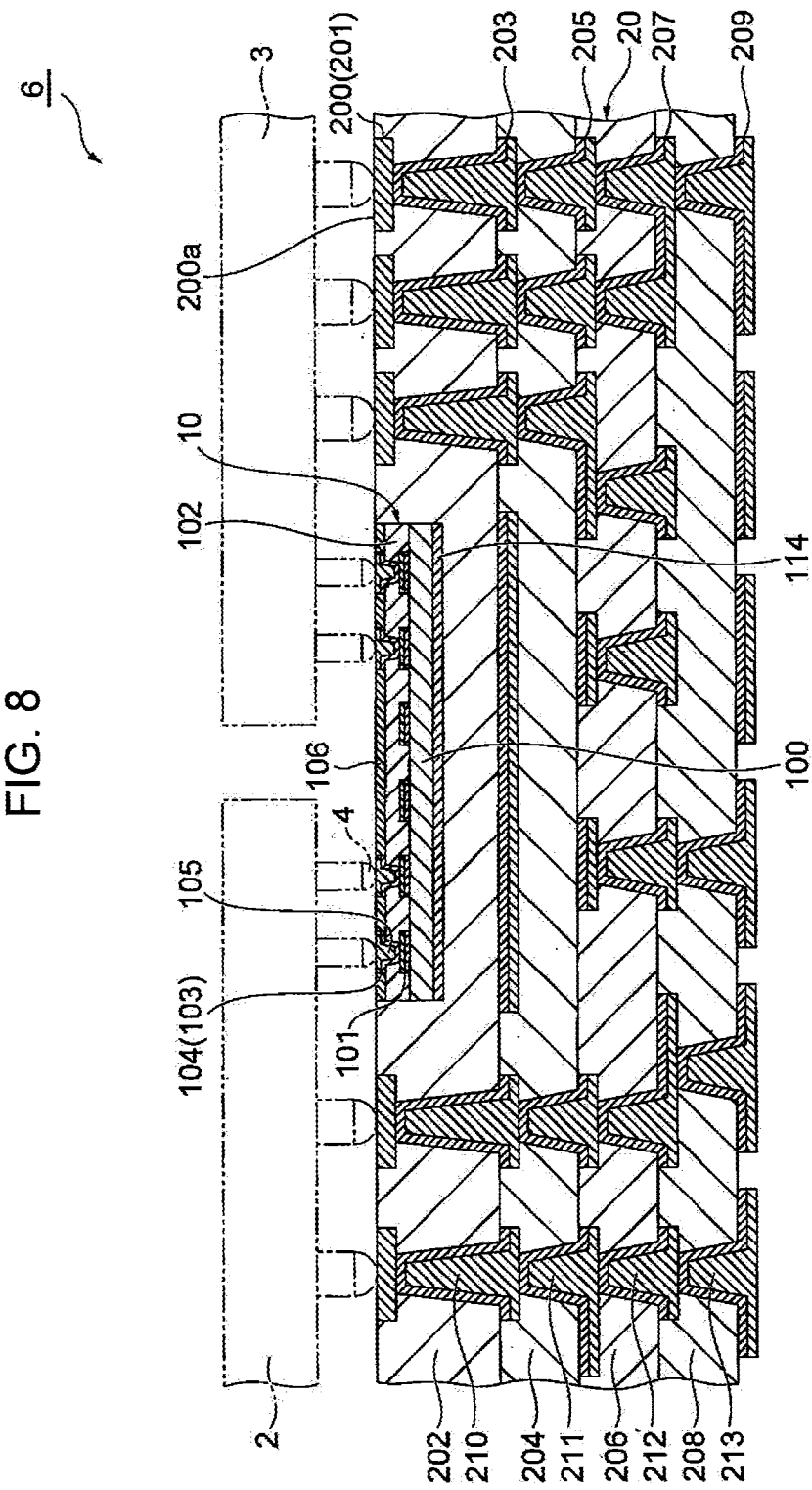
FIG. 8 is a cross-sectional view showing part of a multilayer wiring board according to a third embodiment.

A third embodiment of the present invention is described below by referring to FIG. 8. Multilayer wiring board 6 of the present embodiment is different from the first embodiment in that heat-dissipation member 114 is provided therein, but the rest of the structure is the same as that in the first embodiment.

More specifically, heat-dissipation member 114 is provided under the lower surface of sub-insulation layer 100 in wiring structure body 10. Heat-dissipation member 114 is a metal-plated layer made of copper plating, for example, and is preferred to be 10~80 μm thick. Heat-dissipation member 114 may also be made of a metal-plated layer using other metal materials, a metal plate, or a nanocarbon material instead of a copper-plated layer.

Since the rest of multilayer wiring board 6 of the present embodiment is structured the same as in the first embodiment, the same effects described above are achieved. In addition, since heat-dissipation member 114 is provided in wiring structure body 10, heat generated in MPU 2 and DRAM 3 is effectively dissipated to the outside, thus mitigating impact derived from thermal stress. Accordingly, reliability of multilayer wiring board 6 is further enhanced.

Fourth Embodiment

Figure 9:
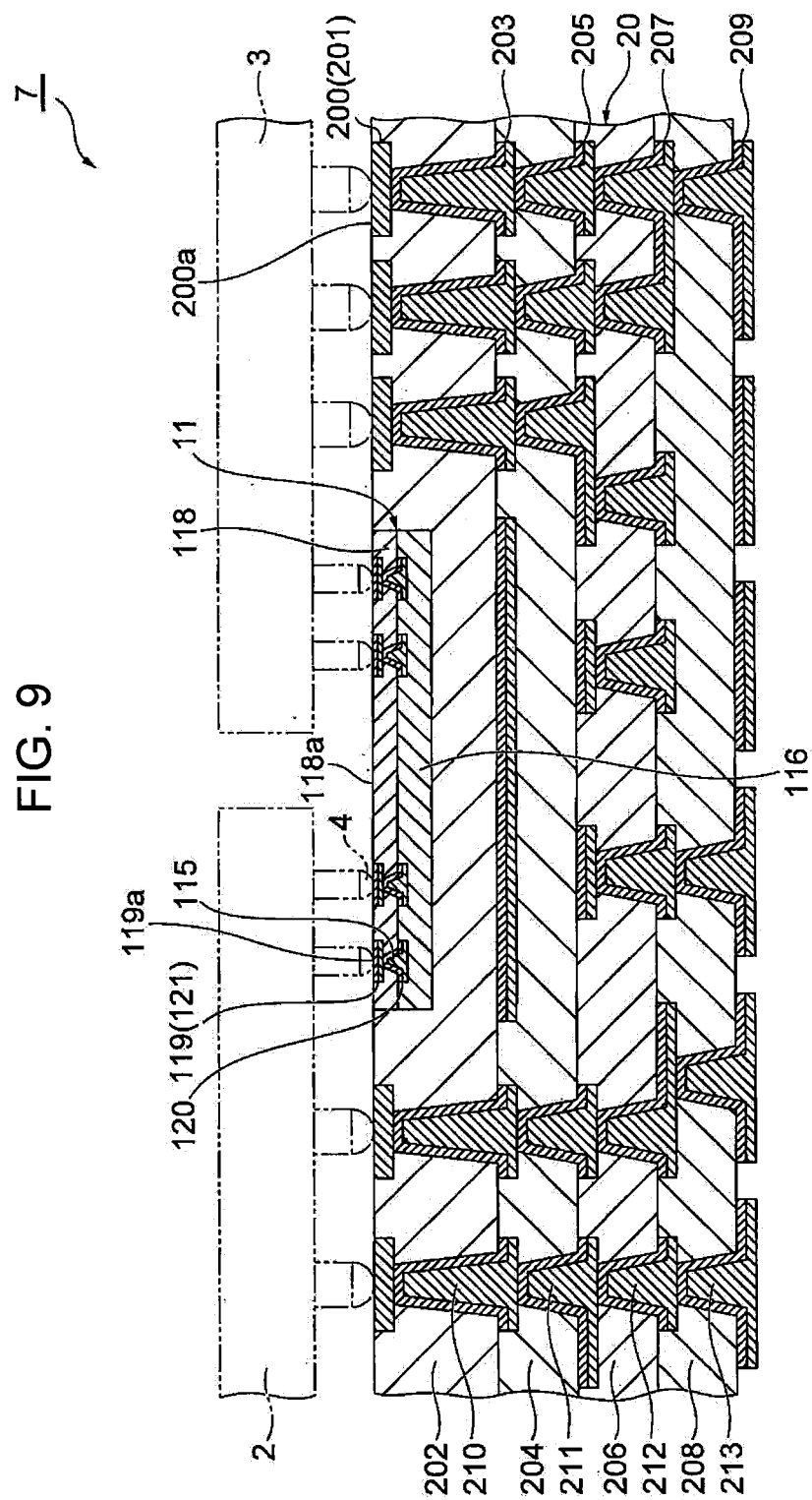
FIG. 9 is a cross-sectional view showing part of a multilayer wiring board according to a fourth embodiment.

A fourth embodiment of the present invention is described below by referring to FIG. 9. The direction of diameters to increase in sub-via conductors 115 is the same as that in main via conductors (210, 211, 212, 213). The rest of the structure is the same as that in the first embodiment.

More specifically, wiring structure body 11 has sub-insulation layers (116, 118). Outermost sub-insulation layer 118 of wiring structure body 11 is provided with sub-conductive layer (second conductive layer) 121, which includes multiple sub-mounting pads (second mounting pads) 119 for mounting MPU 2 and DRAM 3. Sub-mounting pads 119 are dedicated for signal transmission only, and are made of a seed layer and copper-plated layer. Sub-mounting pads 119 are embedded in sub-insulation layer 118 in a way to expose their upper surfaces (119*a*). Upper surfaces (119*a*) of sub-mounting pads 119 are made flush with upper surface (118*a*) of sub-insulation layer 118.

In sub-insulation layer 118, multiple sub-via conductors 115 are formed to electrically connect sub-mounting pads 119 and sub-conductive layer 120. The diameters of sub-via conductors 115 are set to increase in a direction away from MPU 2 and DRAM 3 the same as main via conductors (210, 211, 212, 213). Since the rest of multilayer wiring board 7 of the present embodiment is structured the same as in the first embodiment, the same effects described above are achieved.

Fifth Embodiment

Figure 10:
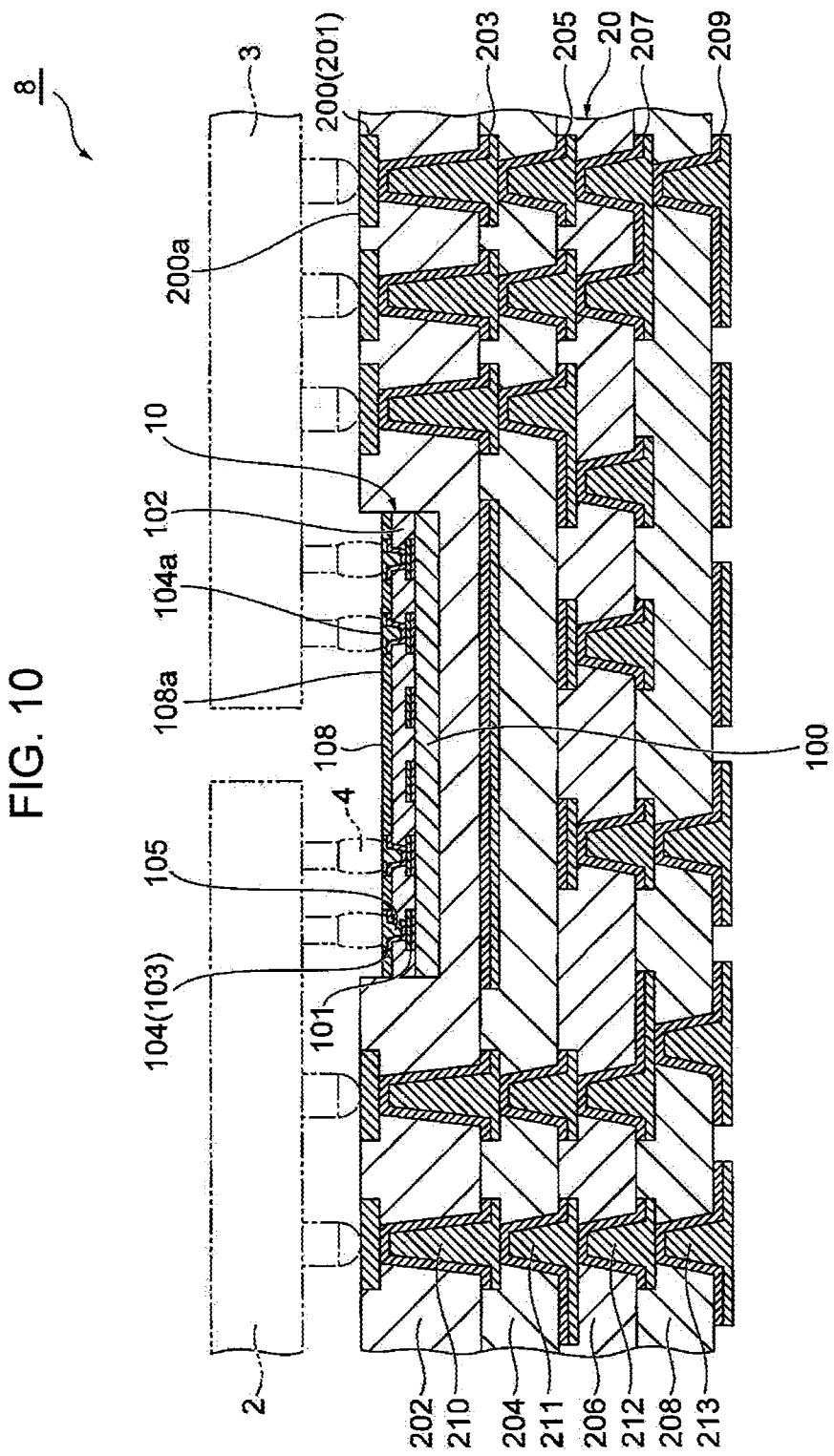
FIG. 10 is a cross-sectional view showing part of a multilayer wiring board according to a fifth embodiment.

A fifth embodiment of the present invention is described below by referring to FIG. 10. Multilayer wiring board 8 of the present embodiment is different from the first embodiment in that upper surfaces (104*a*) of sub-mounting pads 104 are set to be lower than upper surfaces (200*a*) of main mounting pads 200, but the rest of the structure is the same as in the first embodiment.

More specifically, upper surfaces (104*a*) of sub-mounting pads 104 in wiring structure body 10 are not made flush with upper surfaces (200*a*) of main mounting pads 200 in main wiring board 20, but are set to be lower than upper surfaces (200*a*). Namely, upper surfaces (104*a*) of sub-mounting pads 104 in wiring structure body 10 are recessed inward into main wiring board 20 from upper surfaces (200*a*) of main mounting pads 200. Sub-insulation layer 108 made of photosensitive resin is filled among sub-mounting pads 104. Upper surface (108*a*) of sub-insulation layer 108 is made flush with upper surfaces (104*a*) of sub-mounting pads 104. Since the rest of multilayer wiring board 8 of the present embodiment is structured the same as in the first embodiment, the same effects described above are achieved.

Sixth Embodiment

Figure 11:
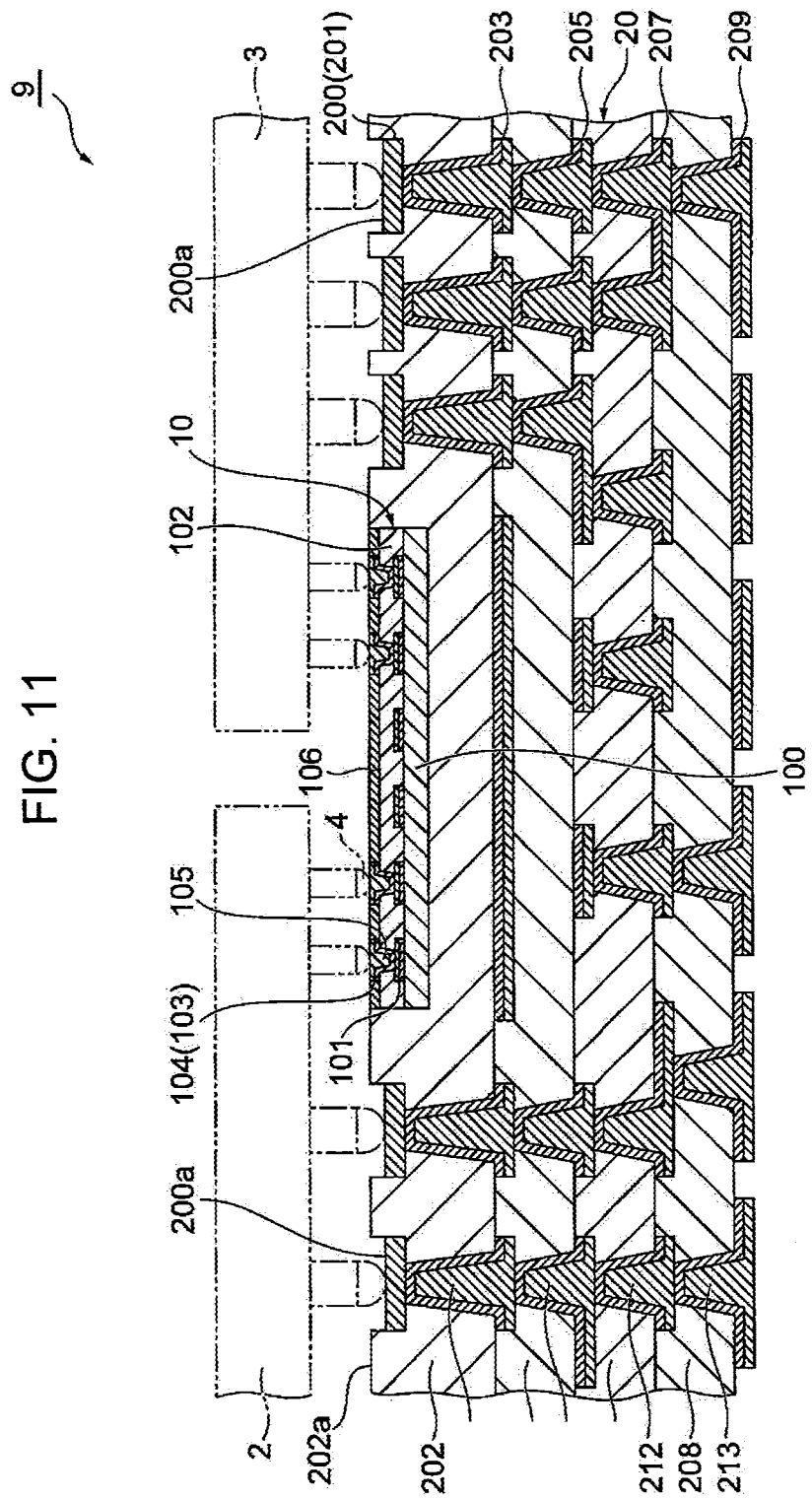
FIG. 11 is a cross-sectional view showing part of a multilayer wiring board according to a sixth embodiment.

A sixth embodiment of the present invention is described below by referring to FIG. 11. Multilayer wiring board 9 of the present embodiment is different from the first embodiment in that upper surfaces (200*a*) of main mounting pads 200 are set to be lower than upper surface (202*a*) of main insulation layer 202, but the rest of the structure is the same as in the first embodiment.

More specifically, upper surfaces (200*a*) of main mounting pads 200 in main wiring board 20 are not made flush with upper surface (202*a*) of main insulation layer 202, but are lower than upper surfaces (202*a*). Namely, upper surfaces (200*a*) of main mounting pads 200 are recessed inward into main wiring board 20 from upper surface (202*a*) of main insulation layer 202. Since the rest of multilayer wiring board 9 of the present embodiment is structured the same as in the first embodiment, the same effects described above are achieved.

So far, embodiments of the present invention have been described in detail. However, the present invention is not limited to the above embodiments, and may also be carried out by making various design modifications that do not deviate from the gist of the present invention described in the scope of patent claims. For example, numbers of sub-insulation layers and sub-conductive layers in wiring structure body 10 and numbers of main insulation layers and conductive layers in main wiring board 20 are not limited to those shown above, and may be modified as applicable. In addition, two electronic components (MPU 2 and DRAM 3) are mounted on the multilayer wiring board in the above embodiment. However, three or more electronic components may also be mounted thereon.

Furthermore, outermost main insulation layer 202 among multiple main insulation layers may be made of multiple resin layers using different materials. For example, main insulation layer 202 may be double-layered with an insulative resin layer containing glass cloth and another insulative resin layer without glass cloth. In such a structure, the insulative resin layer without glass cloth is preferred to be positioned on the outer side (closer to MPU 2 and DRAM 3) of the insulative resin layer containing glass cloth. Such a setting makes it easier to form wiring patterns in main conductive layer 201. Yet alternatively, outermost main insulation layer 202 may be formed with multiple resin layers with different thicknesses, or resin layers using different materials with different thicknesses.

When a multilayer wiring board needs space to have a core substrate, it is difficult to make a thinner wiring board. In addition, when a main wiring board is formed by alternately laminating insulation layers and conductive layers on both sides of the core substrate, not many options are left when selecting a laser for forming via holes, materials for forming interlayer resin insulation layers or the like. As a result, cost reduction is hard to achieve for forming multilayer wiring boards.

A multilayer wiring board according to an embodiment of the present invention is a thinner multilayer wiring board at a reduced cost.

A multilayer wiring board according to an embodiment of the present invention is structured to have the following: a main wiring board, which is provided with laminated multiple insulation layers, multiple first via conductors formed in the multiple insulation layers, and a first conductive layer having multiple first mounting pads for mounting first and second electronic components adjacent to each other; and a wiring structure body, which is provided in the outermost insulation layer among the multiple insulation layers and has a second conductive layer that includes multiple second mounting pads for mounting the first and second electronic components. In such a multilayer wiring board, the multiple first via conductors are set to have diameters increasing in the same direction.

According to an embodiment of the present invention, multiple first via conductors formed in the insulation layers of the main wiring board are set to have diameters increasing in the same direction, enabling all of the first via conductors to be formed from one direction. Thus, it is not necessary to use a core substrate, and the multilayer wiring board is thereby made thinner. In addition, a multilayer wiring board is manufactured by using a coreless method, leaving more options for selecting a laser for forming via holes, materials for interlayer resin insulation layers or the like than when a multilayer wiring board is formed using a core substrate. Accordingly, costs for manufacturing multilayer wiring boards are reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer wiring board, comprising:
a main wiring board comprising a plurality of insulation layers, a plurality of first via conductors formed in the insulation layers, and a first conductive layer including a plurality of first mounting pads such that the plurality of first mounting pads is positioned to mount a first electronic component and a second electronic component adjacent to each other on the main wiring board; and
a wiring structure body mounted on the main wiring board such that the wiring structure body is positioned on a recessed surface of the main wiring board formed in an outermost insulation layer of the insulation layers, the wiring structure body comprising a second conductive layer including a plurality of second mounting pads such that the plurality of second mounting pads is positioned to connect to the first electronic component and the second electronic component mounted on the main wiring board,
wherein the plurality of first via conductors is formed such that the first via conductors have diameters which increase in a same direction away from the plurality of first mounting pads.

2. A multilayer wiring board according to claim 1, wherein the wiring structure body comprises a plurality of second via conductors formed such that the second via conductors have diameters which increase in one direction.

3. A multilayer wiring board according to claim 1, wherein the second conductive layer of the wiring structure body is not in contact with the first conductive layer of the main wiring board.

4. A multilayer wiring board according to claim 1, wherein the plurality of first mounting pads is formed such that the first mounting pads are embedded in the outermost insulation layer of the insulation layers and have exposed surfaces on a surface of the outermost insulation layer on a same plane.

5. A multilayer wiring board according to claim 1, wherein the wiring structure body comprises a plurality of second via conductors formed such that the second via conductors have diameters which increase in a different direction from the direction in which the diameters of the first via conductors increase.

6. A multilayer wiring board according to claim 1, wherein the plurality of first mounting pads in the main wiring board and the plurality of second mounting pads in the wiring structure body are formed such that the first and second mounting pads have mounting surfaces on a same plane.

7. A multilayer wiring board according to claim 1, wherein the plurality of insulation layers is formed such that the outermost insulation layer has a thickness which is greater than a thickness of each of other insulation layers in the plurality of insulation layers.

8. A multilayer wiring board according to claim 1, wherein the plurality of insulation layers is formed such that the outermost insulation layer comprises a plurality of resin layers comprising different materials.

9. A multilayer wiring board according to claim 1, wherein the plurality of insulation layers is formed such that the outermost insulation layer comprises a plurality of resin layers having different thicknesses.

10. A multilayer wiring board according to claim 1, wherein the second conductive layer of the wiring structure body is a dedicated conductive layer configured to transmit signal between the first electronic component and the second electronic component.

11. A multilayer wiring board according to claim 1, wherein the plurality of first mounting pads in the main wiring board and the plurality of second mounting pads in the wiring structure body are formed such that the first and second mounting pads have roughed mounting surfaces, respectively.

12. A multilayer wiring board according to claim 1, wherein the plurality of first mounting pads in the main wiring board and the plurality of second mounting pads in the wiring structure body are formed such that the first and second mounting pads have mounting surfaces having surface treatment films, respectively.

13. A multilayer wiring board according to claim 1, wherein the wiring structure body comprises a heat dissipation component.

14. A multilayer wiring board according to claim 1, wherein the wiring structure body comprises a heat dissipation component comprising one of a metal plate, a metal-plated layer and a nanocarbon material.

15. A multilayer wiring board according to claim 1, wherein the second conductive layer of the wiring structure body comprises a wiring layer having a wiring width which is smaller than a wiring width of the first conductive layer of the main wiring board.

16. A multilayer wiring board according to claim 15, wherein the second conductive layer of the wiring structure body comprises the wiring layer having the wiring width which is in a range of 1 μm to 5 μm.

* * * * *